(12) United States Patent  (10) Patent No.: US 8,541,887 B2
Sasaki et al.  (45) Date of Patent: Sep. 24, 2013

(54) LAYERED CHIP PACKAGE AND METHOD OF MANUFACTURING SAME

(75) Inventors: Yoshitaka Sasaki, Milpitas, CA (US);
Hiroyuki Ito, Milpitas, CA (US);
Hiroshi Ikejima, Hong Kong (CN);
Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 153 days.

(21) Appl. No.: 12/875,710

(22) Filed: Sep. 3, 2010

(65) Prior Publication Data

US 2012/0056333 A1   Mar. 8, 2012

(51) Int. Cl.
*H01L 25/00* (2006.01)

(52) U.S. Cl.
USPC ............ 257/777; 257/E25.001; 257/E21.499; 438/107; 438/109; 438/598; 438/597

(58) Field of Classification Search
USPC .......... 257/777, E25.001, E21.499; 438/107, 438/109, 598, 597
See application file for complete search history.

(56) References Cited

U.S. PATENT DOCUMENTS

| | | | |
|---|---|---|---|
| 5,953,588 A | 9/1999 | Camien et al. | |
| 6,582,992 B2 | 6/2003 | Poo et al. | |
| 7,127,807 B2 | 10/2006 | Yamaguchi et al. | |
| 7,745,259 B2 | 6/2010 | Sasaki et al. | |
| 7,755,176 B1 | 7/2010 | St. Amand et al. | |
| 7,863,095 B2 | 1/2011 | Sasaki et al. | |
| 7,868,442 B2 | 1/2011 | Sasaki et al. | |
| 7,877,874 B2 | 2/2011 | Val | |
| 7,968,374 B2 | 6/2011 | Sasaki et al. | |
| 8,324,741 B2 | 12/2012 | Sasaki et al. | |
| 8,358,015 B2 | 1/2013 | Sasaki et al. | |

(Continued)

FOREIGN PATENT DOCUMENTS

| JP | A-2002-50735 | 2/2002 |
|---|---|---|
| JP | A-2003-163324 | 6/2003 |

(Continued)

OTHER PUBLICATIONS

U.S. Appl. No. 12/902,600, filed Oct. 12, 2010 in the name of Sasaki et al.

(Continued)

*Primary Examiner* — S. V. Clark
*Assistant Examiner* — Krista Soderholm
(74) *Attorney, Agent, or Firm* — Oliff & Berridge, PLC

(57) ABSTRACT

A layered chip package includes a main body, and wiring that includes a plurality of wires disposed on a side surface of the main body. The main body includes: a main part including first and second layer portions; and a plurality of first and second terminals that are disposed on the top and bottom surfaces of the main part, respectively, and are electrically connected to the plurality of wires. Each layer portion includes a semiconductor chip having a first surface and a second surface opposite thereto, and includes a plurality of electrodes. The electrodes are disposed on a side of the semiconductor chip opposite to the second surface. The first and second layer portions are bonded to each other such that the respective second surfaces face each other. The first terminals are formed by using the electrodes of the first layer portion, and the second terminals are formed by using the electrodes of the second layer portion.

22 Claims, 28 Drawing Sheets

(56) References Cited

U.S. PATENT DOCUMENTS

| | | | |
|---|---|---|---|
| 2001/0000053 A1* | 3/2001 | Suh et al. | 257/686 |
| 2003/0146012 A1 | 8/2003 | Song et al. | |
| 2007/0165461 A1 | 7/2007 | Cornwell et al. | |
| 2007/0216006 A1 | 9/2007 | Park et al. | |
| 2008/0179728 A1 | 7/2008 | Ikeda | |
| 2008/0227238 A1 | 9/2008 | Ko et al. | |
| 2008/0289174 A1 | 11/2008 | Val | |
| 2009/0051046 A1 | 2/2009 | Yamazaki et al. | |
| 2010/0008058 A1 | 1/2010 | Saen et al. | |
| 2010/0200977 A1 | 8/2010 | Sasaki et al. | |
| 2011/0221073 A1 | 9/2011 | Sasaki et al. | |

FOREIGN PATENT DOCUMENTS

| | | |
|---|---|---|
| JP | A-2006-148161 | 6/2006 |
| JP | A-2009-111384 | 5/2007 |
| JP | A-2009-521116 | 5/2009 |
| JP | A-2010-114155 | 5/2010 |
| JP | A-2010-183058 | 8/2010 |
| WO | WO 2008/085391 A2 | 7/2008 |

OTHER PUBLICATIONS

U.S. Appl. No. 12/896,283, filed Oct. 1, 2010 in the name of Sasaki et al.
U.S. Appl. No. 13/156,808, filed Jun. 9, 2011 in the name of Sasaki et al.
U.S. Appl. No. 13/156,941, filed Jun. 9, 2011 in the name of Sasaki et al.
K. Gann, "Neo-Stacking Technology," HDI Magazine, Dec. 1999.
Sep. 25, 2012 Notice of Reasons for Rejection issued in Japanese Patent Application No. 2011-106804 (with translation).
Sep. 25, 2012 Notice of Reasons for Rejection issued in Japanese Patent Application No. 2011-106803 (with translation).
Apr. 18, 2013 Office Action issued in U.S. Appl. No. 12/902,600.
Dec. 12, 2012 Office Action issued in U.S. Appl. No. 12/902,600.
Jun. 6, 2013 Office Action issued in U.S. Appl. No. 13/156,808.

* cited by examiner

LAYERED CHIP PACKAGE AND METHOD OF MANUFACTURING SAME

BACKGROUND OF THE INVENTION

1. Field of the Invention

The present invention relates to a layered chip package that includes a plurality of semiconductor chips stacked, and to a method of manufacturing the same.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires hamper quick circuit operation.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; filling the plurality of holes with metal such as Cu by plating to form the through electrodes; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal. This tends to reduce the reliability of wiring formed by the through electrodes.

According to the through electrode method, vertically adjacent chips are physically joined to each other by connecting the through electrodes of the upper chip and those of the lower chip by soldering, for example. The through electrode method therefore requires that the vertically adjacent chips be accurately aligned and then joined to each other at high temperatures. When the vertically adjacent chips are joined to each other at high temperatures, however, misalignment between the vertically adjacent chips can occur due to expansion and contraction of the chips, which often results in electrical connection failure between the vertically adjacent chips.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

The manufacturing method disclosed in U.S. Pat. No. 5,953,588 requires a large number of steps and this raises the cost for the layered chip package. According to the method, after a plurality of chips cut out from a processed wafer are embedded into the embedding resin, a plurality of leads are formed to be connected to each chip to thereby fabricate the neo-wafer, as described above. Accurate alignment between the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

With the multilayer module disclosed in U.S. Pat. No. 7,127,807 B2, it is impossible to increase the proportion of the area occupied by the electronic element in each active layer, and consequently it is difficult to achieve higher integration.

For a wafer to be cut into a plurality of chips, the yield of the chips, that is, the rate of conforming chips with respect to all chips obtained from the wafer, is 90% to 99% in many cases. Since a layered chip package includes a plurality of chips, the rate of layered chip packages in which all of the plurality of chips are conforming ones is lower than the yield of the chips. The larger the number of chips included in each layered chip package, the lower the rate of layered chip packages in which all of the chips are conforming ones.

A case will now be considered where a layered chip package is used to form a memory device such as a flash memory. For a memory device such as a flash memory, a redundancy technique of replacing a defective column of memory cells with a redundant column of memory cells is typically employed so that the memory device can normally function even when some memory cells are defective. The redundancy technique can also be employed in the case of forming a memory device using a layered chip package. This makes it possible that, even if some of memory cells included in any chip are defective, the memory device can normally function while using the chip including the defective memory cells. Suppose, however, that a chip including a control circuit and a plurality of memory cells has become defective due to, for example, a wiring failure of the control circuit, and the chip cannot function normally even by employing the redundancy technique. In such a case, the defective chip is no longer usable. While the defective chip can be replaced with a conforming one, it increases the cost for the layered chip package.

In order to reduce the possibility for a single layered chip package to include a defective chip, a possible approach is to reduce the number of chips included in each layered chip package. In such a case, a plurality of layered chip packages that include only conforming chips can be electrically connected to each other to form a memory device that includes a desired number of chips. This, however, gives rise to the problem of complicated wiring for electrically connecting the plurality of layered chip packages.

OBJECT AND SUMMARY OF THE INVENTION

It is an object of the present invention to provide a layered chip package, a composite layered chip package, and methods of manufacturing the same that make it possible to stack a plurality of layered chip packages and electrically connect them to each other with simple configuration, whereby a package including a desired number of semiconductor chips can be implemented at low cost.

A layered chip package of the present invention includes: a main body having a top surface, a bottom surface, and four side surfaces; and wiring that includes a plurality of wires disposed on at least one of the side surfaces of the main body. The main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires. Each of the first and second layer portions includes a semiconductor chip and a plurality of electrodes, the semiconductor chip having a first surface and a second surface opposite to the first surface. The plurality of electrodes are disposed on a side of the semiconductor chip opposite to the second surface. The first layer portion and the second layer portion are bonded to each other such that the respective second surfaces face each other. The plurality of first terminals are formed by using the plurality of electrodes of the first layer portion. The plurality of second terminals are formed by using the plurality of electrodes of the second layer portion.

In the layered chip package of the present invention, the plurality of electrodes of the first layer portion and those of the second layer portion may have the same layout. In such a case, the plurality of electrodes may include a plurality of first terminal component parts that are used to form the plurality of first terminals in the first layer portion, and a plurality of second terminal component parts that are used to form the plurality of second terminals in the second layer portion. The plurality of electrodes may further include one or more connecting parts that electrically connect one of the first terminal component parts and one of the second terminal component parts to each other.

In the layered chip package of the present invention, the plurality of electrodes may include a plurality of chip connection electrodes for electrical connection to the semiconductor chip. In at least one of the first and second layer portions, the plurality of chip connection electrodes may be in contact with and electrically connected to the semiconductor chip.

In the layered chip package of the present invention, the plurality of electrodes of the first layer portion may include one or more electrodes that are not used to form the plurality of first terminals, while the plurality of electrodes of the second layer portion may include one or more electrodes that are not used to form the plurality of second terminals.

In the layered chip package of the present invention, the plurality of second terminals may be positioned to overlap the plurality of first terminals as viewed in a direction perpendicular to the top surface of the main body. In such a case, the plurality of second terminals may be electrically connected to corresponding ones of the first terminals via the respective wires to constitute a plurality of pairs of the first and second terminals, the first and second terminals in each of the pairs being electrically connected to each other. The plurality of pairs may include a plurality of non-overlapping terminal pairs. Each of the non-overlapping terminal pairs consists of any one of the first terminals and any one of the second terminals, the first and second terminals in each of the non-overlapping terminal pairs being electrically connected to each other and being positioned not to overlap each other as viewed in the direction perpendicular to the top surface of the main body.

When the plurality of pairs include the plurality of non-overlapping terminal pairs, the plurality of pairs may further include a plurality of overlapping terminal pairs. Each of the overlapping terminal pairs consists of any one of the first terminals and any one of the second terminals, the first and second terminals in each of the overlapping terminal pairs being electrically connected to each other and being positioned to overlap each other as viewed in the direction perpendicular to the top surface of the main body. The plurality of wires may include: a chip connection wire that is electrically connected to any one of the plurality of non-overlapping terminal pairs and used for electrical connection to the semiconductor chip of at least one of the first and second layer portions; and a bypass wire that is electrically connected to any one of the plurality of non-overlapping terminal pairs and to neither of the semiconductor chips included in the first and second layer portions.

In the layered chip package of the present invention, the semiconductor chip may include a plurality of memory cells.

In the layered chip package of the present invention, the semiconductor chip may have four side surfaces. Each of the first and second layer portions may further include an insulating portion that covers at least one of the four side surfaces of the semiconductor chip. In such a case, the insulating portion may have at least one end face that is located in the at least one of the side surfaces of the main body on which the plurality of wires are disposed.

In the layered chip package of the present invention, one of the first and second layer portions may be a first-type layer portion, whereas the other of the first and second layer portions may be a second-type layer portion. In the first-type layer portion, the semiconductor chip is electrically connected to two or more of the plurality of wires. In the second-type layer portion, the semiconductor chip is electrically connected to none of the wires. The semiconductor chip of the first-type layer portion may be a normally functioning one, whereas the semiconductor chip of the second-type layer portion may be a malfunctioning one.

A method of manufacturing layered chip packages of the present invention is a method by which a plurality of layered chip packages of the invention are manufactured. The manufacturing method includes the steps of fabricating a layered substructure by stacking two substructures each of which includes an array of a plurality of preliminary layer portions, each of the preliminary layer portions being intended to become one of the first and second layer portions, the substructures being intended to be cut later at positions of boundaries between every adjacent ones of the preliminary layer portions; and forming the plurality of layered chip packages from the layered substructure.

In the method of manufacturing the layered chip packages of the present invention, the plurality of electrodes may include a plurality of chip connection electrodes for electrical connection to the semiconductor chip. In such a case, the step of fabricating the layered substructure includes, as a series of steps for forming each of the substructures, the steps of: fabricating a pre-substructure wafer that includes an array of a plurality of pre-semiconductor-chip portions, the pre-semiconductor-chip portions being intended to become the semiconductor chips, respectively; distinguishing the plurality of pre-semiconductor-chip portions included in the pre-substructure wafer into normally functioning pre-semiconductor-chip portions and malfunctioning pre-semiconductor-chip portions; and forming the plurality of chip connection electrodes so that the pre-substructure wafer is made into the substructure, the plurality of chip connection electrodes being formed such that they are in contact with and electrically connected to the normally functioning pre-semiconductor-chip portions while not in contact with the malfunctioning pre-semiconductor-chip portions.

A composite layered chip package of the present invention includes a plurality of subpackages stacked, every vertically adjacent two of the subpackages being electrically connected to each other. Each of the plurality of subpackages includes: a main body having a top surface, a bottom surface and four side surfaces; and wiring that includes a plurality of wires disposed on at least one of the side surfaces of the main body. The main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires. Each of the first and second layer portions includes a semiconductor chip and a plurality of electrodes, the semiconductor chip having a first surface and a second surface opposite to the first surface. The plurality of electrodes are disposed on a side of the semiconductor chip opposite to the second surface. The first layer portion and the second layer portion are bonded to each other such that the respective second surfaces face each other. The plurality of first terminals are formed by using the plurality of electrodes of the first layer portion. The plurality of second terminals are formed by using the plurality of electrodes of the second layer portion. For any vertically adjacent two of the subpackages, the plurality of second terminals of the upper one of the subpackages are electrically connected to the plurality of first terminals of the lower one.

In the composite layered chip package of the present invention, the plurality of electrodes of the first layer portion and those of the second layer portion may have the same layout. In such a case, the plurality of electrodes may include a plurality of first terminal component parts that are used to form the plurality of first terminals in the first layer portion, and a plurality of second terminal component parts that are used to form the plurality of second terminals in the second layer portion. The plurality of electrodes may further include one or more connecting parts that electrically connect one of the first terminal component parts and one of the second terminal component parts to each other.

In the composite layered chip package of the present invention, the plurality of electrodes may include a plurality of chip connection electrodes for electrical connection to the semiconductor chip. In at least one of the first and second layer portions, the plurality of chip connection electrodes may be in contact with and electrically connected to the semiconductor chip.

In the composite layered chip package of the present invention, the plurality of electrodes of the first layer portion may include one or more electrodes that are not used to form the plurality of first terminals, while the plurality of electrodes of the second layer portion may include one or more electrodes that are not used to form the plurality of second terminals.

In the composite layered chip package of the present invention, the plurality of second terminals may be positioned to overlap the plurality of first terminals as viewed in a direction perpendicular to the top surface of the main body. In such a case, the plurality of second terminals may be electrically connected to corresponding ones of the first terminals via the respective wires to constitute a plurality of pairs of the first and second terminals, the first and second terminals in each of the pairs being electrically connected to each other. The plurality of pairs may include a plurality of non-overlapping terminal pairs. Each of the non-overlapping terminal pairs consists of any one of the first terminals and any one of the second terminals, the first and second terminals in each of the non-overlapping terminal pairs being electrically connected to each other and being positioned not to overlap each other as viewed in the direction perpendicular to the top surface of the main body.

When the plurality of pairs include the plurality of non-overlapping terminal pairs, the plurality of pairs may further include a plurality of overlapping terminal pairs. Each of the overlapping terminal pairs consists of any one of the first terminals and any one of the second terminals, the first and second terminals in each of the overlapping terminal pairs being electrically connected to each other and being positioned to overlap each other as viewed in the direction perpendicular to the top surface of the main body. The plurality of wires may include: a chip connection wire that is electrically connected to any one of the plurality of non-overlapping terminal pairs and used for electrical connection to the semiconductor chip of at least one of the first and second layer portions; and a bypass wire that is electrically connected to any one of the plurality of non-overlapping terminal pairs and to neither of the semiconductor chips included in the first and second layer portions.

In the composite layered chip package of the present invention, the semiconductor chip may include a plurality of memory cells.

In at least one of the plurality of subpackages of the composite layered chip package of the present invention, one of the first and second layer portions may be a first-type layer portion, whereas the other of the first and second layer portions may be a second-type layer portion. In the first-type layer portion, the semiconductor chip is electrically connected to two or more of the plurality of wires. In the second-type layer portion, the semiconductor chip is electrically connected to none of the wires. In such a case, the composite layered chip package may further include an additional portion that is electrically connected to any of the plurality of subpackages. The additional portion includes at least one additional semiconductor chip, and additional portion wiring that defines electrical connections between the at least one additional semiconductor chip and the plurality of first or second terminals of any of the plurality of subpackages so that the at least one additional semiconductor chip substitutes for the semiconductor chip of the second-type layer portion of at least one of the subpackages.

The additional portion may include an additional portion main body having a top surface, a bottom surface, and four side surfaces. The additional portion main body may include the at least one additional semiconductor chip. The additional portion wiring may include: a plurality of additional portion wires that are disposed on at least one of the side surfaces of the additional portion main body; a plurality of first additional portion terminals that are disposed on the top surface of the additional portion main body and electrically connected to the plurality of additional portion wires; and a plurality of second additional portion terminals that are disposed on the bottom surface of the additional portion main body and electrically connected to the plurality of additional portion wires. The semiconductor chip in each of the layer portions and the additional semiconductor chip may each include a plurality of memory cells.

A first manufacturing method according to the present invention is a method of manufacturing a composite layered chip package including a plurality of subpackages. The method includes the steps of: fabricating the plurality of subpackages; and stacking the plurality of subpackages and electrically connecting them to each other.

A second manufacturing method according to the present invention is a method of manufacturing a composite layered chip package including a plurality of subpackages and an additional portion. The method includes the steps of: fabricating the plurality of subpackages; fabricating the additional portion; and stacking the plurality of subpackages and the additional portion and electrically connecting them to each other.

According to the layered chip package, the composite layered chip package, and the methods of manufacturing the same of the present invention, the plurality of first terminals and the plurality of second terminals can be used to stack and electrically connect a plurality of layered chip packages (subpackages). In the present invention, the first layer portion and the second layer portion are bonded to each other such that the respective second surfaces face each other. The plurality of first terminals are formed by using the plurality of electrodes of the first layer portion. The plurality of second terminals are formed by using the plurality of electrodes of the second layer portion. According to the present invention, the electrical connection between the plurality of layered chip packages (subpackages) can thus be achieved with simple configuration. Consequently, according to the present invention, a plurality of layered chip packages (subpackages) can be stacked on each other and electrically connected to each other with simple configuration. This makes it possible to implement a package including a desired number of semiconductor chips at low cost.

According to the composite layered chip package and the methods of manufacturing the same of the present invention, a plurality of subpackages and an additional portion are stacked, and the additional portion is electrically connected to any of the plurality of subpackages. This makes it possible to easily implement a package that is capable of providing, even if it includes a malfunctioning semiconductor chip, the same functions as those for the case where no malfunctioning semiconductor chip is included.

Other and further objects, features and advantages of the present invention will appear more fully from the following description.

DETAILED DESCRIPTION OF THE PREFERRED EMBODIMENTS

First Embodiment

Figure 1:
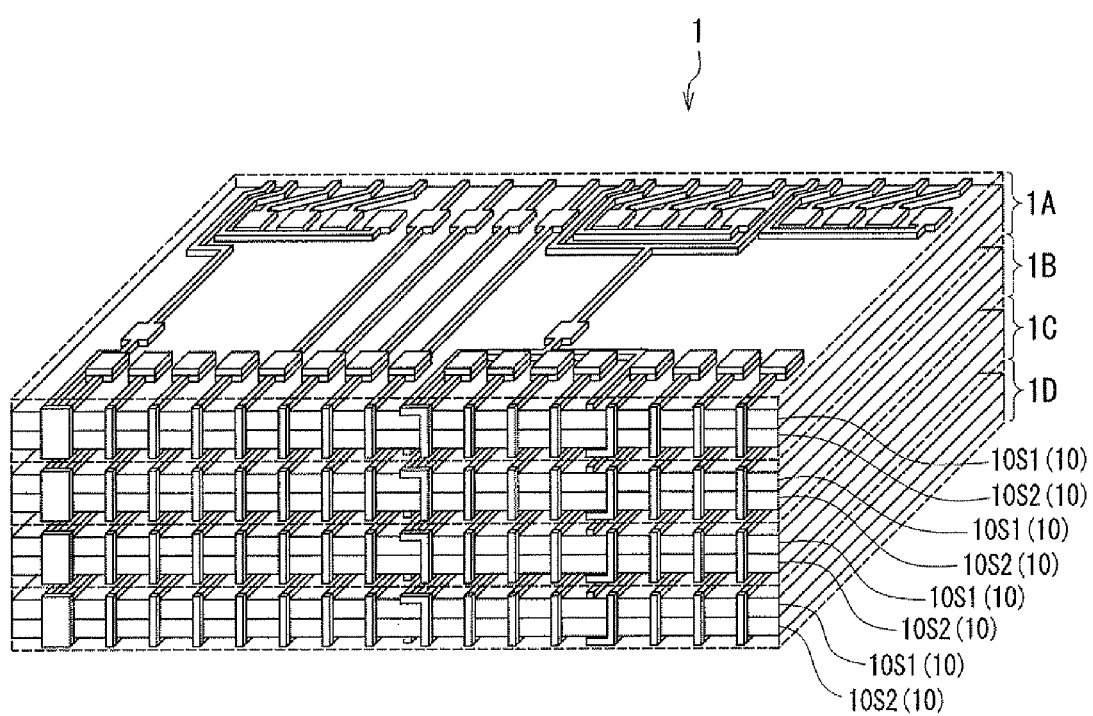
FIG. 1 is a perspective view of a composite layered chip package according to a first embodiment of the invention.
Figure 2:
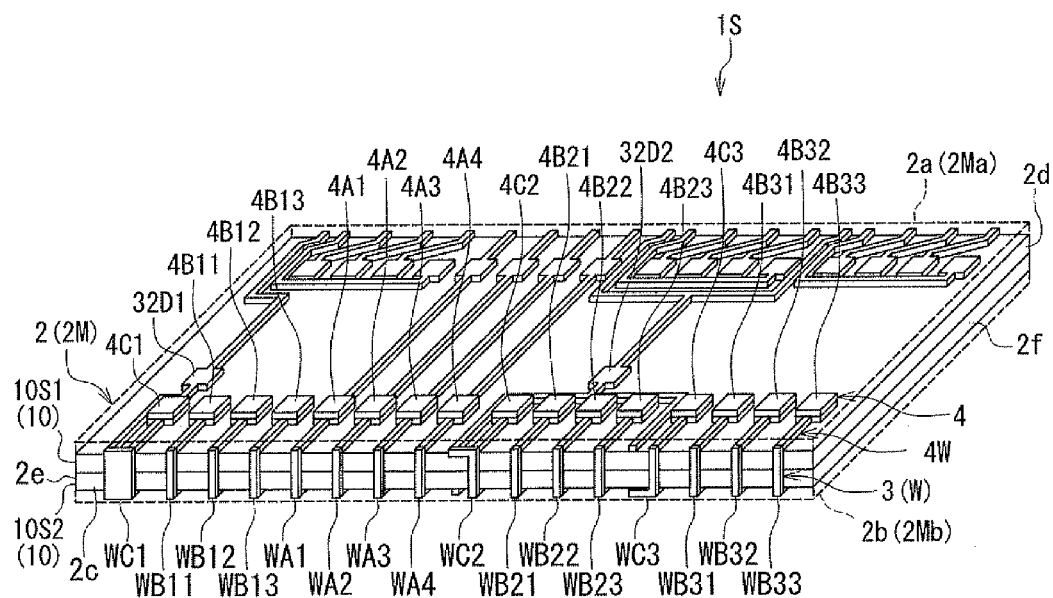
FIG. 2 is a perspective view of a layered chip package according to the first embodiment of the invention.
Figure 3:
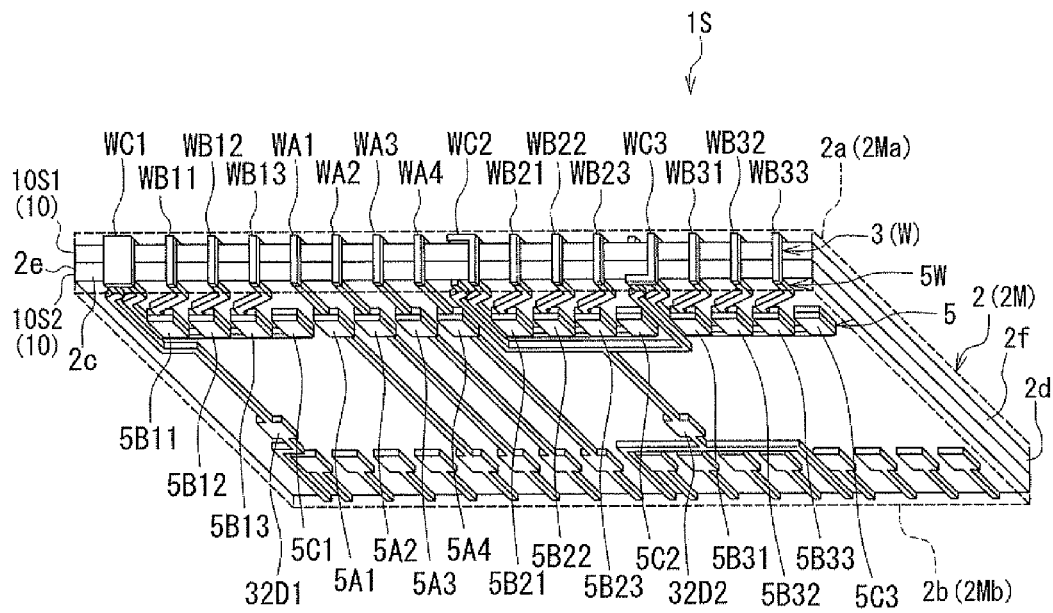
FIG. 3 is a perspective view showing the layered chip package of FIG. 2 as viewed from below.
Figure 4:
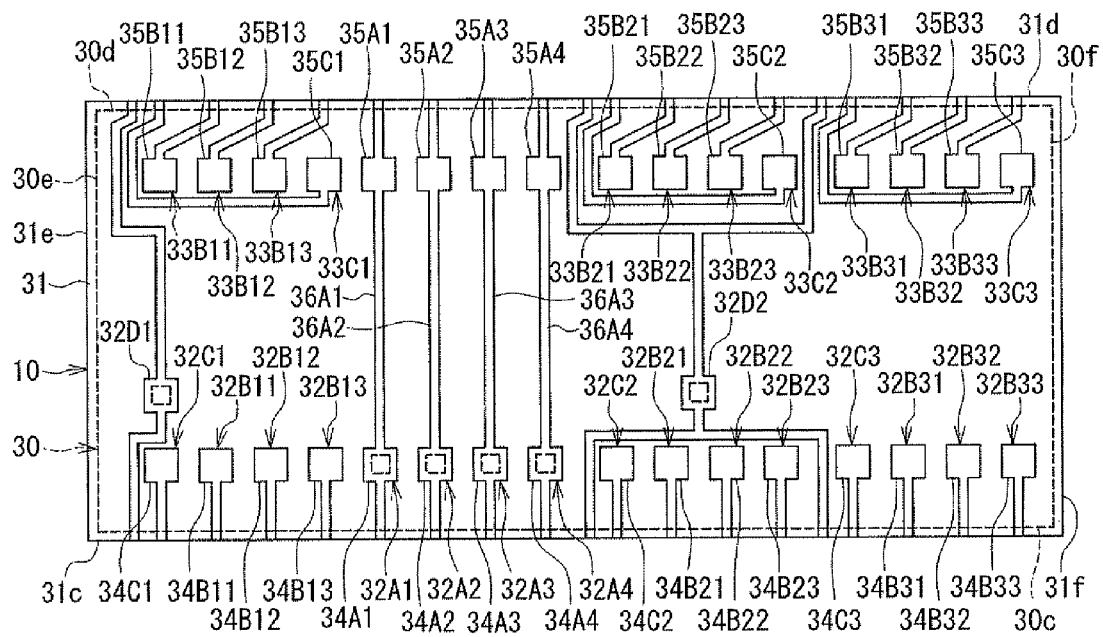
FIG. 4 is a plan view showing a layer portion included in the layered chip package of FIG. 2.
Figure 5:
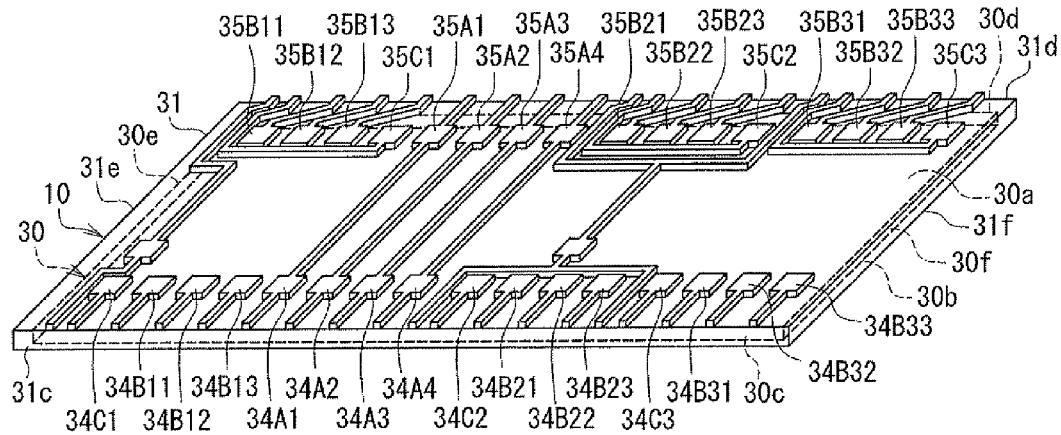
FIG. 5 is a perspective view of the layer portion shown in FIG. 4.

Preferred embodiments of the present invention will now be described in detail with reference to the drawings. First, reference is made to FIG. 1 to FIG. 5 to describe the configurations of a layered chip package and a composite layered chip package according to a first embodiment of the invention. FIG. 1 is a perspective view of the composite layered chip package according to the present embodiment. FIG. 2 is a perspective view of the layered chip package according to the present embodiment. FIG. 3 is a perspective view showing the layered chip package of FIG. 2 as viewed from below. FIG. 4 is a plan view showing a layer portion included in the layered chip package of FIG. 2. FIG. 5 is a perspective view of the layer portion shown in FIG. 4.

As shown in FIG. 1, the composite layered chip package 1 according to the present embodiment includes a plurality of subpackages stacked, every two vertically adjacent subpackages being electrically connected to each other. FIG. 1 shows an example where the composite layered chip package 1 includes four subpackages 1A, 1B, 1C, and 1D that are arranged in order from the top. In the following description, any subpackage will be designated by reference symbol 1S. The subpackage 1S is the layered chip package according to the present embodiment.

As shown in FIG. 2 and FIG. 3, the subpackage 1S includes a main body 2 having a top surface 2a, a bottom surface 2b, and four side surfaces 2c, 2d, 2e and 2f. The side surfaces 2c and 2d are mutually opposite to each other. The side surfaces 2e and 2f are mutually opposite to each other. The subpackage 1S further includes wiring 3 that includes a plurality of wires W disposed on at least one of the side surfaces of the main body 2. In the example shown in FIG. 2 and FIG. 3, the plurality of wires W are disposed only on the side surface 2c. The main body 2 includes a main part 2M having a top surface 2Ma and a bottom surface 2Mb. The main part 2M includes a first layer portion 10S1 and a second layer portion 10S2 stacked. The first layer portion 10S1 lies on the second layer portion 10S2. Hereinafter, either layer portion will be represented by reference numeral 10.

The main body 2 further includes a plurality of first terminals 4 and a plurality of second terminals 5. The plurality of first terminals 4 are disposed on the top surface 2Ma of the main part 2M and electrically connected to the plurality of wires W. The plurality of second terminals 5 are disposed on the bottom surface 2Mb of the main part 2M and electrically connected to the plurality of wires W. The main body 2 further includes top wiring 4W and bottom wiring 5W. The top wiring 4W is disposed on the top surface 2Ma of the main part 2M and electrically connects the plurality of first terminals 4 to the plurality of wires W. The bottom wiring 5W is disposed on the bottom surface 2Mb of the main part 2M and electrically connects the plurality of second terminals 5 to the plurality of wires W.

The plurality of second terminals 5 are positioned to overlap the plurality of first terminals 4 as viewed in a direction perpendicular to the top surface 2a of the main body 2. When a plurality of subpackages 1S are stacked on each other, the plurality of second terminals 5 of the upper one of the subpackages 1S are therefore opposed to the plurality of first terminals 4 of the lower one. In the present embodiment, when a plurality of subpackages 1S are stacked on each other, the plurality of second terminals 5 of the upper one of any two vertically adjacent subpackages 1S are electrically connected to the plurality of first terminals 4 of the lower one.

At least either the terminals 4 or the terminals 5 may each include a solder layer made of a solder material, the solder layer being exposed in the surface of each of the terminals 4 or each of the terminals 5. In such a case, the solder layers are heated to melt and then solidified, whereby the plurality of second terminals 5 of the upper one of two vertically adjacent subpackages 1S are electrically connected to the plurality of first terminals 4 of the lower one.

The first and second layer portions 10S1 and 10S2 are stacked between the top surface 2Ma and the bottom surface 2Mb of the main part 2M. The first and second layer portions 10S1 and 10S2 are bonded to each other with an adhesive, for example.

A description will now be given of the layer portions 10 with reference to FIG. 4 and FIG. 5. Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other.

Each of the layer portions 10 further includes an insulating portion 31 and a plurality of electrodes. The insulating portion 31 covers at least one of the four side surfaces of the semiconductor chip 30. The insulating portion 31 has at least one end face that is located in the at least one of the side surfaces of the main body 2 on which the plurality of wires W are disposed. In the example shown in FIG. 4 and FIG. 5, the insulating portion 31 covers all of the four side surfaces 30c, 30d, 30e and 30f of the semiconductor chip 30, and has four end faces 31c, 31d, 31e and 31f located in the four side surfaces of the main body 2. The four end faces 31c, 31d, 31e, and 31f of the insulating portion 31 lie outside the four side surfaces 30c, 30d, 30e, and 30f of the semiconductor chip 30, respectively. The plurality of electrodes are disposed on a side of the semiconductor chip 30 opposite to the second surface 30b.

In the present embodiment, the first and second layer portions 10S1 and 10S2 have the same configuration in appearance, both being as shown in FIG. 4 and FIG. 5. The layer portion 10S1 and the layer portion 10S2, however, are situated in different orientations in the main part 2M. More specifically, the first layer portion 10S1 is arranged with the first surface 30a of the semiconductor chip 30 upward and the side surfaces 30c, 30d, 30e, and 30f of the semiconductor chip 30 toward the side surfaces 2c, 2d, 2e, and 2f of the main body 2, respectively. The second layer portion 10S2 is arranged with the first surface 30a of the semiconductor chip 30 downward and the side surfaces 30d, 30c, 30e, and 30f of the semiconductor chip 30 toward the side surfaces 2c, 2d, 2e, and 2f of the main body 2, respectively. The first layer portion 10S1 and the second layer portion 10S2 are bonded to each other such that the respective second surfaces 30b face each other.

In at least one of the first and second layer portions 10S1 and 10S2 in a single subpackage 1S, the semiconductor chip 30 is electrically connected to two or more of the plurality of wires W via two or more of the plurality of electrodes.

A detailed description will now be given of the plurality of terminals 4 and 5, the plurality of wires W, and the plurality of electrodes of the present embodiment. In the present embodiment, the plurality of second terminals 5 are electrically connected to corresponding ones of the first terminals 4 via the wires W to constitute a plurality of pairs of the first terminal 4 and the second terminal 5. The first terminal 4 and the second terminal 5 in each of the pairs are electrically connected to each other. The plurality of pairs include a plurality of non-overlapping terminal pairs. Each of the non-overlapping terminal pairs consists of any one of the first terminals 4 and any one of the second terminals 5, the first and second terminals 4 and 5 in each of the non-overlapping terminal pairs being electrically connected to each other and being positioned not to overlap each other as viewed in the direction perpendicular to the top surface 2a of the main body 2. The plurality of pairs further include a plurality of overlapping terminal pairs. Each of the overlapping terminal pairs consists of any one of the first terminals 4 and any one of the second terminals 5, the first and second terminals 4 and 5 in each of the overlapping terminal pairs being electrically connected to each other and being positioned to overlap each other as viewed in the direction perpendicular to the top surface 2a of the main body 2.

In the example shown in FIG. 2 and FIG. 3, the plurality of first terminals 4 include first-type terminals 4A1, 4A2, 4A3, and 4A4, second-type terminals 4B11, 4B12, 4B13, 4B21, 4B22, 4B23, 4B31, 4B32, and 4B33, and third-type terminals 4C1, 4C2, and 4C3. Similarly, the plurality of second terminals 5 include first-type terminals 5A1, 5A2, 5A3, and 5A4, second-type terminals 5B11, 5B12, 5B13, 5B21, 5B22, 5B23, 5B31, 5B32, and 5B33, and third-type terminals 5C1, 5C2, and 5C3. The terminals 5A1 to 5A4, 5B11 to 5B13, 5B21 to 5B23, 5B31 to 5B33, and 5C1 to 5C3 are paired with the terminals 4A1 to 4A4, 4B11 to 4B13, 4B21 to 4B23, 4B31 to 4B33, and 4C1 to 4C3, respectively.

In each of the pairs of terminals (4A1, 5A1), (4A2, 5A2), (4A3, 5A3), and (4A4, 5A4), the first terminal 4 and the second terminal 5 are electrically connected to each other and are positioned to overlap each other as viewed in the direction perpendicular to the top surface 2a of the main body 2. These pairs are thus the overlapping terminal pairs.

In each of the pairs of terminals (4B11, 5B11), (4B12, 5B12), (4B13, 5B13), (4B21, 5B21), (4B22, 5B22), (4B23, 5B23), (4B31, 5B31), (4B32, 5B32), (4B33, 5B33), (4C1, 5C1), (4C2, 5C2), and (4C3, 5C3), the first terminal 4 and the second terminal 5 are electrically connected to each other and are positioned not to overlap each other as viewed in the direction perpendicular to the top surface 2a of the main body 2. These pairs are thus the non-overlapping terminal pairs.

The terminals 5B11, 5B12, 5B13, 5C1, 5B21, 5B22, 5B23, 5C2, 5B31, 5B32, 5B33, and 5C3 are positioned to overlap the terminals 4C1, 4B11, 4B12, 4B13, 4C2, 4B21, 4B22, 4B23, 4C3, 4B31, 4B32, and 4B33, respectively, as viewed in the direction perpendicular to the top surface 2a of the main body 2.

The plurality of wires W include first-type wires WA1, WA2, WA3, and WA4, second-type wires WB11, WB12, WB13, WB21, WB22, WB23, WB31, WB32, and WB33, and third-type wires WC1, WC2, and WC3. The first-type wires WA1, WA2, WA3, and WA4 electrically connect the first terminal 4 and the second terminal 5 in the overlapping terminal pairs (4A1, 5A1), (4A2, 5A2), (4A3, 5A3), and (4A4, 5A4), respectively. The plurality of first-type wires WA1 to WA4 have a use common to the first and second layer portions 10S1 and 10S2 in the main part 2M.

The second-type wires WB11, WB12, WB13, WB21, WB22, WB23, WB31, WB32, and WB33 electrically connect the first terminal 4 and the second terminal 5 in the non-overlapping terminal pairs (4B11, 5B11), (4B12, 5B12), (4B13, 5B13), (4B21, 5B21), (4B22, 5B22), (4B23, 5B23), (4B31, 5B31), (4B32, 5B32), and (4B33, 5B33), respectively. The second-type wires are electrically connected to neither of two semiconductor chips 30 included in the first and second layer portions 10S1 and 10S2 in the main part 2M. The second-type wires are thus the bypass wires according to the invention.

The third-type wires WC1, WC2, and WC3 electrically connect the first terminal 4 and the second terminal 5 in the non-overlapping terminal pairs (4C1, 5C1), (4C2, 5C2), and (4C3, 5C3), respectively. The third-type wires are used for electrical connection to the semiconductor chip 30 of at least one of the first and second layer portions 10S1 and 10S2 in the main part 2M. The third-type wires are thus the chip connection wires according to the invention.

On the top surface 2Ma of the main part 2M, as shown in FIG. 2, the first terminals 4A1 to 4A4, 4B11 to 4B13, 4B21 to 4B23, 4B31 to 4B33, and 4C1 to 4C3 are electrically connected to their respective closest wires WA1 to WA4, WB11 to WB13, WB21 to WB23, WB31 to WB33, and WC1 to WC3. On the bottom surface 2Mb of the main part 2M, as shown in FIG. 3, the terminals 5A1 to 5A4 among the plurality of second terminals 5 are electrically connected to their respective closest wires WA1 to WA4. Meanwhile, among the plurality of second terminals 5, the terminals 5B11 to 5B13, 5B21 to 5B23, and 5B31 to 5B33 are respectively electrically connected to the wires WB11 to WB13, WB21 to WB23, and WB31 to WB33 which are adjacent to their respective closest wires. The terminals 5C1, 5C2, and 5C3 are respectively electrically connected to the wires WC1, WC2, and WC3 which are closest to the terminals 5B11, 5B21, and 5B31, respectively.

As will be detailed later, the plurality of first terminals 4 are formed by using the plurality of electrodes of the first layer portion 10S1, and the plurality of second terminals 5 are formed by using the plurality of electrodes of the second layer portion 10S2. In the present embodiment, the plurality of electrodes of the first layer portion 10S1 and those of the second layer portion 10S2 have the same layout. The plurality of electrodes include a plurality of first terminal component parts that are used to form the plurality of first terminals 4 in the first layer portion 10S1, and a plurality of second terminal component parts that are used to form the plurality of second terminals 5 in the second layer portion 10S2. As shown in FIG. 4 and FIG. 5, the plurality of electrodes include the following first- to sixth-type electrodes.

The first-type electrodes 32A1, 32A2, 32A3, and 32A4 extend in a direction parallel to the side surfaces 30e and 30f of the semiconductor chip 30 and the end faces 31e and 32f of the insulating portion 31. Each of the electrodes 32A1, 32A2, 32A3, and 32A4 has an end face located in the end face 31c of the insulating portion 31, and an end face located in the end face 31d of the insulating portion 31.

The electrode 32A1 includes a first terminal component part 34A1 that is used to form the terminal 4A1 in the first layer portion 10S1, a second terminal component part 35A1 that is used to form the terminal 5A1 in the second layer portion 10S2, and a connecting part 36A1 that electrically connects the terminal component parts 34A1 and 35A1 to each other.

The electrode 32A2 includes a first terminal component part 34A2 that is used to form the terminal 4A2 in the first layer portion 10S1, a second terminal component part 35A2 that is used to form the terminal 5A2 in the second layer portion 10S2, and a connecting part 36A2 that electrically connects the terminal component parts 34A2 and 35A2 to each other.

The electrode 32A3 includes a first terminal component part 34A3 that is used to form the terminal 4A3 in the first layer portion 10S1, a second terminal component part 35A3 that is used to form the terminal 5A3 in the second layer portion 10S2, and a connecting part 36A3 that electrically connects the terminal component parts 34A3 and 35A3 to each other.

The electrode 32A4 includes a first terminal component part 34A4 that is used to form the terminal 4A4 in the first layer portion 10S1, a second terminal component part 35A4 that is used to form the terminal 5A4 in the second layer portion 10S2, and a connecting part 36A4 that electrically connects the terminal component parts 34A4 and 35A4 to each other.

In the first layer portion 10S1, the first-type wires WA1 to WA4 are respectively electrically connected to the end faces of the electrodes 32A1 to 32A4 that are located in the end face 31c of the insulating portion 31. On the other hand, in the second layer portion 10S2, the first-type wires WA1 to WA4 are respectively electrically connected to the end faces of the electrodes 32A1 to 32A4 that are located in the end face 31d of the insulating portion 31. In at least one of the first and second layer portions 10S1 and 10S2, the first-type electrodes 32A1 to 32A4 are in contact with and electrically connected to the semiconductor chip 30. In FIG. 4, the dashed squares in the electrodes 32A1 to 32A4 represent the areas where the electrodes 32A1 to 32A4 make contact with the semiconductor chip 30.

Each of the second-type electrodes 32B11 to 32B13, 32B21 to 32B23, and 32B31 to 32B33 has an end face located in the end face 31c of the insulating portion 31. The electrodes 32B11 to 32B13, 32B21 to 32B23, and 32B31 to 32B33 respectively include first terminal component parts 34B11 to 34B13, 34B21 to 34B23, and 34B31 to 34B33 that are used to form the terminals 4B11 to 4B13, 4B21 to 4B23, and 4B31 to 4B33, respectively, in the first layer portion 10S1. In the first layer portion 10S1, the electrodes 32B11 to 32B13, 32B21 to 32B23, and 32B31 to 32B33 are electrically connected to the second-type wires WB11 to WB13, WB21 to WB23, and WB31 to WB33, respectively. On the other hand, in the second layer portion 10S2, the electrodes 32B11 to 32B13, 32B21 to 32B23, and 32B31 to 32B33 are electrically connected to none of the wires. The second-type electrodes are not in contact with the semiconductor chip 30.

Each of the third-type electrodes 32C1 to 32C3 has an end face located in the end face 31c of the insulating portion 31. The electrodes 32C1 to 32C3 respectively include first terminal component parts 34C1 to 34C3 that are used to form the terminals 4C1 to 4C3, respectively, in the first layer portion 10S1. In the first layer portion 10S1, the electrodes 32C1 to 32C3 are electrically connected to the third-type wires WC1 to WC3, respectively. On the other hand, in the second layer portion 10S2, the electrodes 32C1 to 32C3 are electrically connected to none of the wires. The third-type electrodes are not in contact with the semiconductor chip 30.

Each of the fourth-type electrodes 33B11 to 33B13, 33B21 to 33B23, and 33B31 to 33B33 has an end face located in the end face 31d of the insulating portion 31. The electrodes 33B11 to 33B13, 33B21 to 33B23, and 33B31 to 33B33 respectively include second terminal component parts 35B11 to 35B13, 35B21 to 35B23, and 35B31 to 35B33 that are used to form the terminals 5B11 to 5B13, 5B21 to 5B23, and 5B31 to 5B33, respectively, in the second layer portion 10S2. In the second layer portion 10S2, the electrodes 33B11 to 33B13, 33B21 to 33B23, and 33B31 to 33B33 are electrically connected to the second-type wires WB11 to WB13, WB21 to WB23, and WB31 to WB33, respectively. On the other hand, in the first layer portion 10S1, the electrodes 33B11 to 33B13, 33B21 to 33B23, and 33B31 to 33B33 are electrically connected to none of the wires. The fourth-type electrodes are not in contact with the semiconductor chip 30.

Each of the fifth-type electrodes 33C1 to 33C3 has an end face located in the end face 31d of the insulating portion 31. The electrodes 33C1 to 33C3 respectively include second terminal component parts 35C1 to 35C3 that are used to form the terminals 5C1 to 5C3, respectively, in the second layer portion 10S2. In the second layer portion 10S2, the electrodes 33C1 to 33C3 are electrically connected to the third-type wires WC1 to WC3, respectively. On the other hand, in the first layer portion 10S1, the electrodes 33C1 to 33C3 are electrically connected to none of the wires. The fifth-type electrodes are not in contact with the semiconductor chip 30.

The sixth-type electrodes 32D1 and 32D2 are ones that are not used to form the terminals 4 or 5. The electrode 32D1 has a first end face located in the end face 31c of the insulating portion 31, and a second end face located in the end face 31d of the insulating portion 31. The first end face of the electrode 32D1 is located near the end face of the electrode 32C1 located in the end face 31c. The second end face of the electrode 32D1 is located near the end face of the electrode 33C1 located in the end face 31d.

The electrode 32D2 has first to fourth branched parts. Each of the first and second branched parts has an end face located in the end face 31c of the insulating portion 31. The respective end faces of the first and second branched parts are located near the end faces of two electrodes 32C2 and 32C3, respectively. Each of the third and fourth branched parts has an end face located in the end face 31d of the insulating portion 31. The respective end faces of the third and fourth branched parts are located near the end faces of two electrodes 33C2 and 33C3, respectively.

In at least one of the first and second layer portions 10S1 and 10S2, the sixth-type electrodes 32D1 and 32D2 are in contact with and electrically connected to the semiconductor chip 30. In FIG. 4, the dashed squares in the electrodes 32D1 and 32D2 represent the areas where the electrodes 32D1 and 32D2 make contact with the semiconductor chip 30.

The first-type electrodes 32A1 to 32A4 and the sixth-type electrodes 32D1 and 32D2 are intended for electrical connection to the semiconductor chip 30, and thus correspond to the chip connection electrodes according to the invention.

In the layer portions 10S1 and 10S2, the wire WC1 is broadened, so that the wire WC1 makes contact with the end face of the electrode 32D1. The electrode 32D1 of each of the layer portions 10S1 and 10S2 is thereby electrically connected to the wire WC1. In the layer portion 10S1, the wire WC2 is broadened in part, so that the wire WC2 makes contact with the end face of the first branched part of the electrode 32D2. The electrode 32D2 of the layer portion 10S1 is thereby electrically connected to the wire WC2. In the layer portion 10S2, the wire WC3 is broadened in part, so that the wire WC3 makes contact with the end face of the fourth branched part of the electrode 32D2. The electrode 32D2 of the layer portion 10S2 is thereby electrically connected to the wire WC3.

In the layer portions 10S1 and 10S2, the insulating portion 31 does not cover the plurality of first and second terminal component parts of the plurality of electrodes, but covers the first surface 30a of the semiconductor chip 30 and the other portions of the plurality of electrodes. The first and second terminal component parts not covered by the insulating portion 31 form respective conductor pads. Conductor layers are formed on the conductor pads. The first terminal component parts and the conductor layers in the first layer portion 10S1 constitute the first terminals 4. The second terminal component parts and the conductor layers in the second layer portion 10S2 constitute the second terminals 5. In the present embodiment, the plurality of first terminals 4 are thus formed by using the plurality of electrodes (the plurality of first terminal component parts) of the first layer portion 10S1. Part of the portions of the plurality of electrodes covered by the insulating portion 31 in the layer portion 10S1 forms the top wiring 4W. The plurality of second terminals 5 are formed by using the plurality of electrodes (the plurality of second terminal component parts) of the second layer portion 10S2. Part of the portions of the plurality of electrodes covered by the insulating portion 31 in the layer portion 10S2 forms the bottom wiring 5W. In FIG. 1 to FIG. 3, the insulating portions 31 in the layer portions 10S1 and 10S2 are partly shown in broken lines.

At least one of the first and second layer portions 10S1 and 10S2 in a subpackage 1S is a first-type layer portion. The first and second layer portions 10S1 and 10S2 in a subpackage 1S may include a second-type layer portion. More specifically, one of the first and second layer portions 10S1 and 10S2 may be the first-type layer portion whereas the other of the first and second layer portions 10S1 and 10S2 may be the second-type layer portion.

The semiconductor chip 30 of the first-type layer portion is a normally functioning one, whereas the semiconductor chip 30 of the second-type layer portion is a malfunctioning one. Hereinafter, a normally functioning semiconductor chip 30 will be referred to as a conforming semiconductor chip 30, and a malfunctioning semiconductor chip 30 will be referred to as a defective semiconductor chip 30. Hereinafter, the first-type layer portion will be designated by reference symbol 10A and the second-type layer portion will be designated by reference symbol 10B when the first-type layer portion and the second-type layer portion are to be distinguished from each other.

In the first-type layer portion 10A, the semiconductor chip 30 is electrically connected to two or more of the plurality of wires W. Specifically, in the first-type layer portion 10A, the electrodes 32A1 to 32A4, 32D1, and 32D2 are in contact with and electrically connected to the semiconductor chip 30. Consequently, in the first-type layer portion 10A, the semiconductor chip 30 is electrically connected to the wires WA1 to WA4, the wire WC1, and either one of the wires WC2 and WC3. In the second-type layer portion 10B, none of the electrodes 32A1 to 32A4, 32D1, and 32D2 are in contact with the semiconductor chip 30. Consequently, in the second-type layer portion 10B, the semiconductor chip 30 is electrically connected to none of the wires W.

If at least one of the subpackages 1S in the composite layered chip package 1 includes the second-type layer portion 10B, an additional portion to be described later is added to the plurality of subpackages 1S to form a composite layered chip package 1. This will be described in detail later.

The semiconductor chip 30 may be a memory chip that constitutes a memory such as a flash memory, DRAM, SRAM, MRAM, PROM, or FeRAM. Here, the semiconductor chip 30 includes a plurality of memory cells. In such a case, it is possible to implement a memory device of large capacity by using the composite layered chip package 1 which includes a plurality of semiconductor chips 30. With the composite layered chip package 1 according to the present embodiment, it is also possible to easily implement a memory of various capacities such as 64 GB (gigabytes), 128 GB, and 256 GB, by changing the number of the semiconductor chips 30 to be included in the composite layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be ones used for implementing other devices such as CPUs, sensors, and driving circuits for sensors.

The subpackage 1S or the layered chip package according to the present embodiment includes a plurality of pairs of the first terminal 4 and the second terminal 5, the first and second terminals 4 and 5 being electrically connected to each other by the respective wires W. The plurality of pairs include the plurality of non-overlapping terminal pairs. Consequently, according to the present embodiment, when a plurality of subpackages 1S having the same configuration are stacked on each other and electrically connected to each other, some of a plurality of signals associated with the semiconductor chips 30 that fall on the same layers in the respective plurality of subpackages 1S can be easily made different from one subpackage 1S to another.

Figure 11:
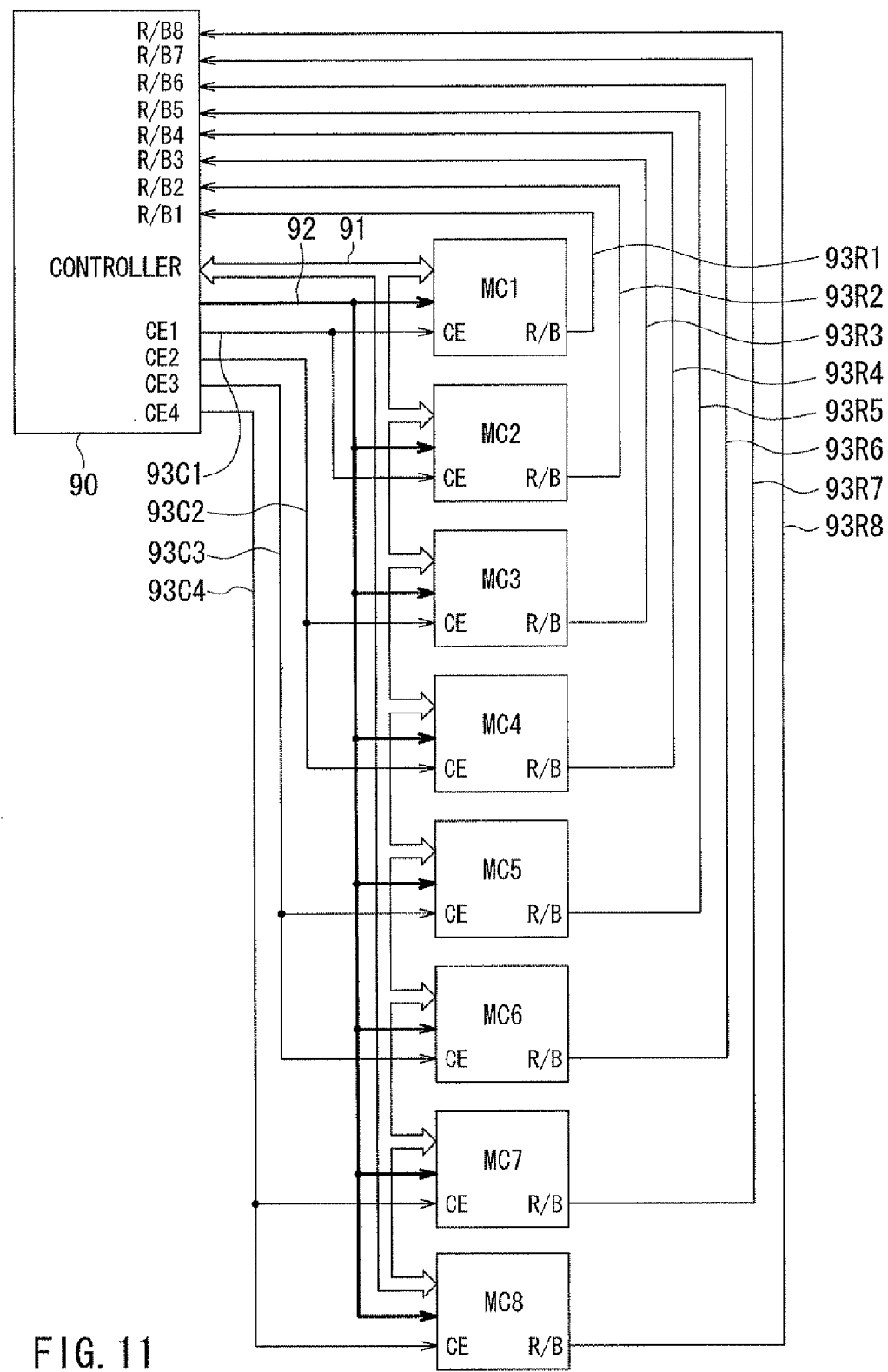
FIG. 11 is a block diagram showing the configuration of a memory device that uses the composite layered chip package according to the first embodiment of the invention.

The layered chip package and the composite layered chip package 1 according to the present embodiment will now be described in more detail with reference to a case where the composite layered chip package 1 is used to construct a memory device. FIG. 11 is a block diagram showing the configuration of the memory device that uses the composite layered chip package 1 according to the embodiment. The memory device includes eight memory chips MC1, MC2, MC3, MC4, MC5, MC6, MC7, and MC8, and a controller 90 which controls these memory chips.

The memory chips MC1, MC2, MC3, MC4, MC5, MC6, MC7, and MC8 are the respective semiconductor chips 30 in the layer portions 10S1 and 10S2 of the subpackage 1A, the layer portions 10S1 and 10S2 of the subpackage 1B, the layer portions 10S1 and 10S2 of the subpackage 1C, and the layer portions 10S1 and 10S2 of the subpackage 1D, which are shown in FIG. 1. Each of the memory chips includes a plurality of memory cells and a peripheral circuit such as an address decoder. The controller 90 is provided independent of the composite layered chip package 1, and is electrically connected to the plurality of first terminals 4 of the subpackage 1A or the plurality of second terminals 5 of the subpackage 1D.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad R/B for outputting a ready/busy signal. The chip enable signal is a signal for controlling whether to select or deselect the memory chip. The ready/busy signal is a signal for indicating the operating state of the memory chip.

The memory device shown in FIG. 11 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads CE of the memory chips MC7 and MC8, and transmits a chip enable signal CE4. Thus, in the example shown in FIG. 11, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided instead of the signal lines 93C1, 93C2, 93C3, and 93C4.

The memory device shown in FIG. 11 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads R/B of the memory chips MC1 to MC8, respectively. The signal lines 93R1 to 93R8 transmit ready/busy signals R/B1 to R/B8, respectively.

A description will now be given of the relationship between the plurality of wires W in the subpackages 1A to 1D shown in FIG. 1 and the plurality of signal lines shown in FIG. 11. In the subpackages 1A to 1D, the terminals 4A1 and 5A1 are electrically connected the wire WA1, the terminals 4A2 and 5A2 are electrically connected to the wire WA2, the terminals 4A3 and 5A3 are electrically connected to the wire WA3, and the terminals 4A4 and 5A4 are electrically connected to the wire WA4. As a result, there are formed a plurality of electrical paths from the terminals 4A1-4A4 of the subpackage 1A to the terminals 5A1-5A4 of the subpackage 1D. The plurality of electrical paths constitute parts of the data bus 91 and the one or more common lines 92.

The terminal 4C1 of the subpackage 1A is electrically connected to the terminal 5C1 of the subpackage 1A via the wire WC1 of the subpackage 1A. The terminal 5C1 of the subpackage 1A is electrically connected to the terminal 4B13 of the subpackage 1B. The terminal 4B13 of the subpackage 1B is electrically connected to the terminal 5B13 of the subpackage 1B via the wire WB13 of the subpackage 1B. The terminal 5B13 of the subpackage 1B is electrically connected to the terminal 4B12 of the subpackage 1C. The terminal 4B12 of the subpackage 1C is electrically connected to the terminal 5B12 of the subpackage 1C via the wire WB12 of the subpackage 1C. The terminal 5B12 of the subpackage 1C is electrically connected to the terminal 4B11 of the subpackage 1D. The terminal 4B11 of the subpackage 1D is electrically connected to the terminal 5B11 of the subpackage 1D via the wire WB11 of the subpackage 1D.

As a result, an electrical path is formed through the terminal 4C1 of the subpackage 1A, the wire WC1 of the subpackage 1A, the terminal 5C1 of the subpackage 1A, the terminal 4B13 of the subpackage 1B, the wire WB13 of the subpackage 1B, the terminal 5B13 of the subpackage 1B, the terminal 4B12 of the subpackage 1C, the wire WB12 of the subpackage 1C, the terminal 5B12 of the subpackage 1C, the terminal 4B11 of the subpackage 1D, the wire WB11 of the subpackage 1D, and the terminal 5B11 of the subpackage 1D. This electrical path constitutes part of the signal line 93C1 shown in FIG. 11. The chip enable signal CE1 is supplied to the electrical path via the terminal 4C1 of the subpackage 1A or the terminal 5B11 of the subpackage 1D. Such an electrical path is electrically connected only to the memory chips MC1 and MC2, that is, the semiconductor chips 30 in the layer portions 10S1 and 10S2 of the subpackage 1A, among the semiconductor chips 30 in all of the layer portions 10 in the subpackages 1A to 1D. The reason is that, in the subpackage 1A, the electrical path runs through the chip connection wire WC1 which is electrically connected to the semiconductor chips 30 in the layer portions 10S1 and 10S2, while in the subpackages 1B to 1D, the electrical path runs through the bypass wires WB13, WB12, and WB11. The electrical path can thus supply the chip enable signal CE1 to only the memory chips MC1 and MC2 among the memory chips MC1 to MC8.

Similarly, there are formed the following three electrical paths: one that can supply the chip enable signal CE2 to only the memory chips MC3 and MC4; one that can supply the chip enable signal CE3 to only the memory chips MC5 and MC6; and one that can supply the chip enable signal CE4 to only the memory chips MC7 and MC8.

In the composite layered chip package 1, an electrical path is also formed through the terminal 4C2 of the subpackage 1A, the wire WC2 of the subpackage 1A, the terminal 5C2 of the subpackage 1A, the terminal 4B23 of the subpackage 1B, the wire WB23 of the subpackage 1B, the terminal 5B23 of the subpackage 1B, the terminal 4B22 of the subpackage 1C, the wire WB22 of the subpackage 1C, the terminal 5B22 of the subpackage 1C, the terminal 4B21 of the subpackage 1D, the wire WB21 of the subpackage 1D, and the terminal 5B21 of the subpackage 1D. This electrical path constitutes part of the signal line 93R1 shown in FIG. 11. The electrical path is electrically connected only to the memory chip MC1, that is, the semiconductor chip 30 in the layer portion 10S1 of the subpackage 1A, among the semiconductor chips 30 in all of the layer portions 10 in the subpackages 1A to 1D. The electrical path can thus transmit the ready/busy signal of only the memory chip MC1 among the memory chips MC1 to MC8, and output the ready/busy signal from the terminal 4C2 of the subpackage 1A or the terminal 5B21 of the subpackage 1D.

Similarly, there are formed seven electrical paths that are each electrically connected to only a corresponding one of the memory chips MC2 to MC8 and can transmit and output the ready/busy signal of that memory chip alone.

According to the example described so far, the chip enable signals or ready/busy signals associated with the semiconductor chips 30 (memory chips) that fall on the same layers in the respective subpackages 1A to 1D of the same configuration can easily be made different between the subpackages 1A to 1D.

Now, a description will be given of remedies according to the present embodiment for coping with situations where at least one of the subpackages 1S in the composite layered chip package 1 includes the second-type layer portion 10B. In such cases, according to the present embodiment, an additional portion 51 is added to the plurality of subpackages 1S to form a composite layered chip package 1.

The additional portion 51 includes at least one additional semiconductor chip, and additional portion wiring. The additional portion wiring defines electrical connections between the at least one additional semiconductor chip and the plurality of first terminals 4 or second terminals 5 of any of the plurality of subpackages 1S so that the at least one additional semiconductor chip substitutes for the semiconductor chip 30 of the second-type layer portion 10B of at least one of the subpackages 1S.

Figure 6:
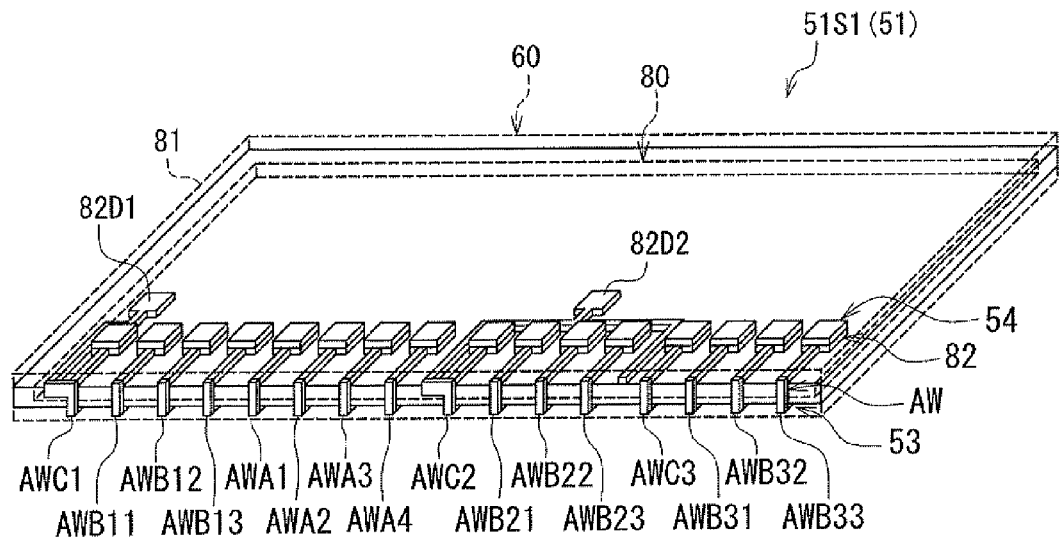
FIG. 6 is a perspective view showing a first example of an additional portion in the first embodiment of the invention.
Figure 7:
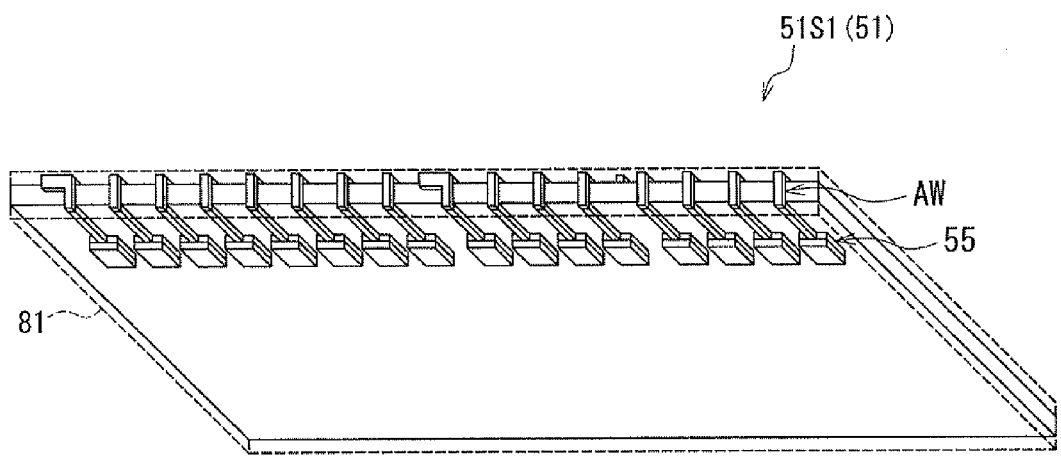
FIG. 7 is a perspective view showing the additional portion of FIG. 6 as viewed from below.
Figure 8:
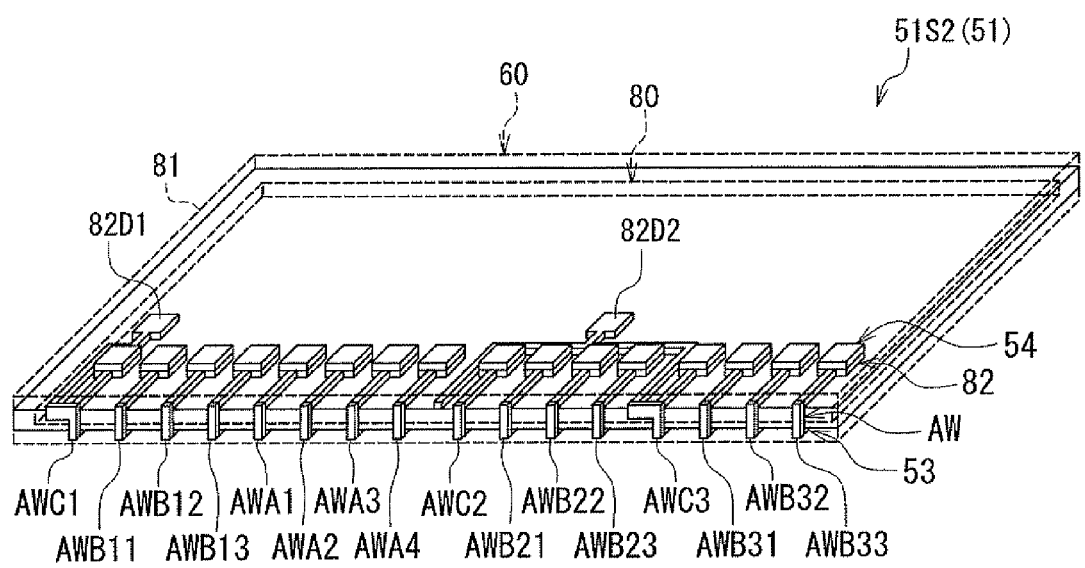
FIG. 8 is a perspective view showing a second example of the additional portion in the first embodiment of the invention.

First and second examples of the additional portion 51 will now be described with reference to FIG. 6 to FIG. 8. Hereinafter, the first example of the additional portion 51 will be designated by reference symbol 51S1, and the second example of the additional portion 51 will be designated by reference symbol 51S2. FIG. 6 is a perspective view of the additional portion 51S1. FIG. 7 is a perspective view showing the additional portion 51S1 of FIG. 6 as viewed from below. FIG. 8 is a perspective view of the additional portion 51S2.

Each of the additional portions 51S1 and 51S2 includes an additional portion main body 60 and additional portion wiring 53. The additional portion main body 60 has a top surface, a bottom surface, and four side surfaces. The additional portion main body 60 includes an additional semiconductor chip 80. The additional semiconductor chip 80 has the same configuration as that of a conforming semiconductor chip 30. The additional portion main body 60 corresponds to a single first-type layer portion 10A.

The additional portion wiring 53 includes: a plurality of additional portion wires AW that are disposed on at least one of the side surfaces of the additional portion main body 60; a plurality of first additional portion terminals 54 that are disposed on the top surface of the additional portion main body 60 and electrically connected to the plurality of additional portion wires AW; and a plurality of second additional portion terminals 55 that are disposed on the bottom surface of the additional portion main body 60 and electrically connected to the plurality of additional portion wires AW. The shape and layout of the plurality of first additional portion terminals 54 are the same as those of the plurality of first terminals 4 shown in FIG. 2. The plurality of second additional portion terminals 55 are positioned to overlap the plurality of first additional portion terminals 54. The plurality of additional portion wires AW electrically connect the first additional portion terminals 54 and the second additional portion terminals 55 that are positioned to overlap each other.

The additional portion main body 60 further includes an insulating portion 81 that covers the top and bottom surfaces and at least one of the four side surfaces of the additional semiconductor chip 80, and a plurality of electrodes 82 that are electrically connected to the plurality of additional portion wires AW. The insulating portion 81 has at least one end face located in the at least one of the side surfaces of the additional portion main body 60 on which the plurality of additional portion wires AW are disposed. In the example shown in FIG. 6 to FIG. 8, the insulating portion 81 covers all of the four side surfaces of the additional semiconductor chip 80, and has four end faces located in the four side surfaces of the additional portion main body 60. The electrodes 82 have their respective end faces that are located in the at least one of the side surfaces of the additional portion main body 60 on which the plurality of additional portion wires AW are disposed. The additional portion wires AW are electrically connected to such end faces. The plurality of first additional portion terminals 54 and the plurality of second additional portion terminals 55 are exposed from the insulating portion 81. In FIG. 6 to FIG. 8, part of the insulating portion 81 is shown by broken lines.

The plurality of electrodes 82 include a plurality of electrodes corresponding to the electrodes 32A1 to 32A4, 32B11 to 32B13, 32B21 to 32B23, 32B31 to 32B33, and 32C1 to 32C3 among the plurality of electrodes shown in FIG. 4 and FIG. 5. Such electrodes each include a terminal component part that constitutes a first additional portion terminal 54, and a part that electrically connects the terminal component part to an additional portion wire AW. The plurality of electrodes 82 further include electrodes 82D1 and 82D2 corresponding to the electrodes 32D1 and 32D2. The plurality of first additional portion terminals 54 are formed by using the plurality of electrodes 82 except the electrodes 82D1 and 82D2. In other words, the terminal component parts of the plurality of electrodes 82 except the electrodes 82D1 and 82D2 form conductor pads. Conductor layers are formed on the conductor pads. The conductor pads and conductor layers constitute the first additional portion terminals 54. The plurality of electrodes 82 corresponding to the electrodes 32A1 to 32A4, and the electrodes 82D1 and 82D2 are in contact with and electrically connected to the additional semiconductor chip 80.

The plurality of additional portion wires AW include wires AWA1 to AWA4, AWB11 to AWB13, AWB21 to AWB23, AWB31 to AWB33, and AWC1 to AWC3 that correspond to the wires WA1 to WA4, WB11 to WB13, WB21 to WB23, WB31 to WB33, and WC1 to WC3, respectively.

In the additional portion 51S1, as shown in FIG. 6 and FIG. 7, the wires AWC1 and AWC2 are broadened in part, so that the electrode 82D1 is electrically connected to the wire AWC1 while the electrode 82D2 is electrically connected to the wire AWC2. The additional portion 51S1 has the same configuration and functions as those of the layer portion 10S1. The additional portion 51S1 is to substitute for the layer portion 10S1 when the layer portion 10S1 is the second-type layer portion 10B.

In the additional portion 51S2 shown in FIG. 8, the wires AWC1 and AWC3 are broadened in part, so that the electrode 82D1 is electrically connected to the wire AWC1 while the electrode 82D2 is electrically connected to the wire AWC3. The additional portion 51S2 has the same configuration and functions as those of the layer portion 10S2. The additional portion 51S2 is to substitute for the layer portion 10S2 when the layer portion 10S2 is the second-type layer portion 10B.

Figure 9:
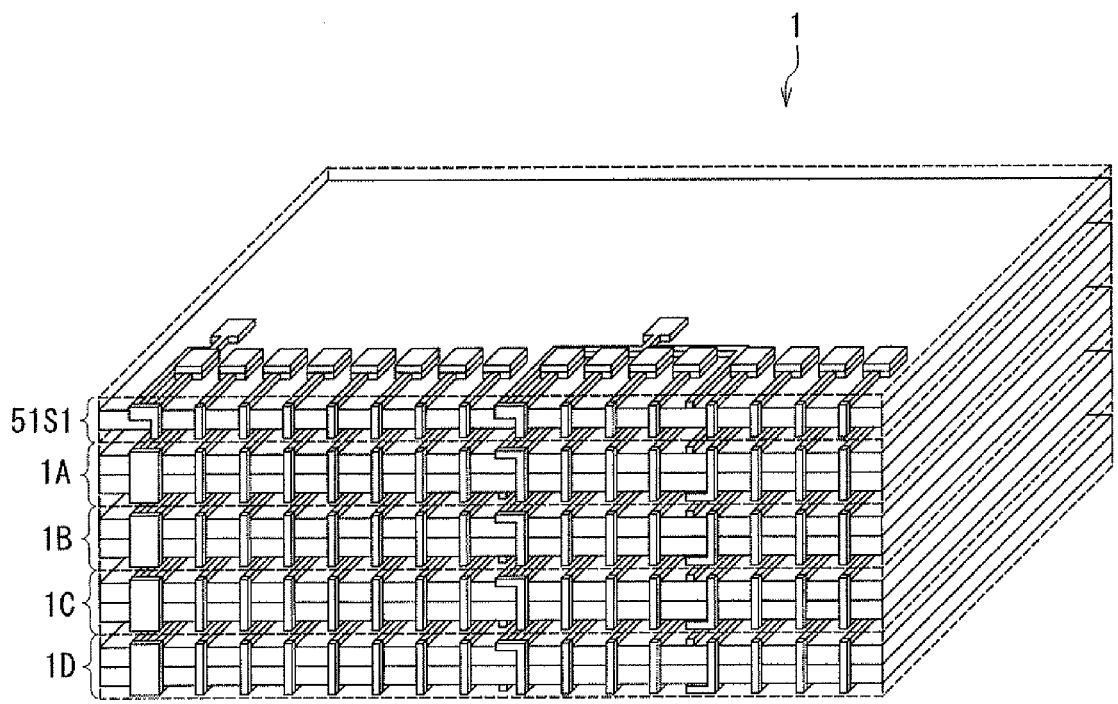
FIG. 9 is a perspective view showing a first example of the composite layered chip package including one additional portion in the first embodiment of the invention.
Figure 10:
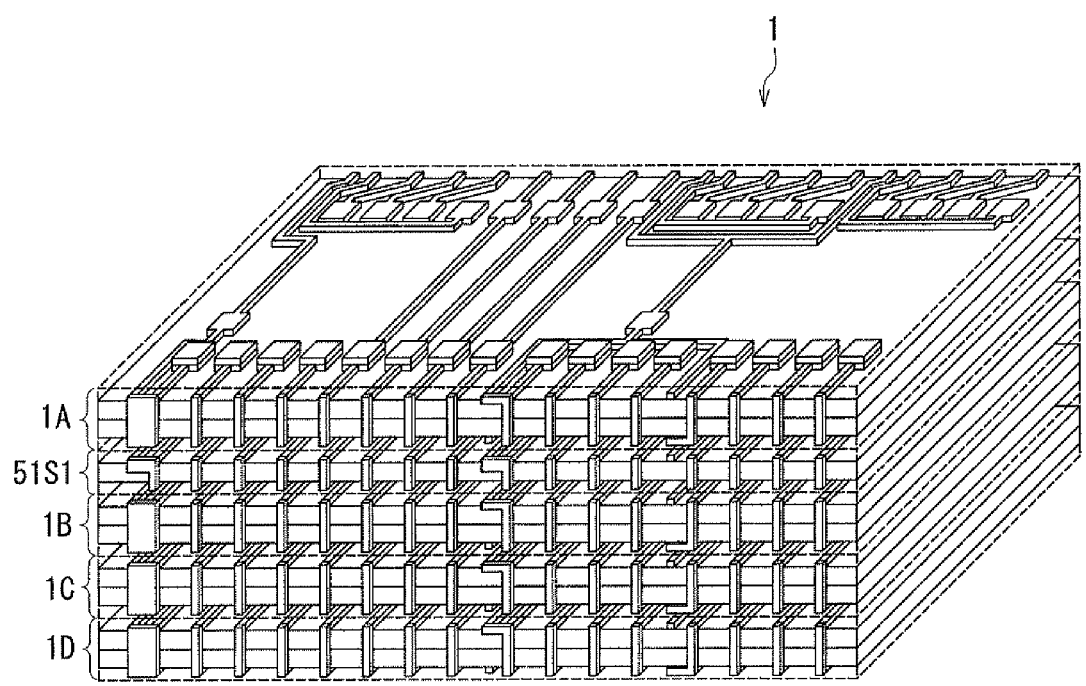
FIG. 10 is a perspective view showing a second example of the composite layered chip package including one additional portion in the first embodiment of the invention.

Now, with reference to FIG. 9 and FIG. 10, a specific description will be given of remedies using the additional portion 51 for coping with situations where at least one of the subpackages 1S in the composite layered chip package 1 includes the second-type layer portion 10B. FIG. 9 is a perspective view showing a first example of the composite layered chip package 1 including a single additional portion 51. FIG. 10 is a perspective view showing a second example of the composite layered chip package 1 including a single additional portion 51.

According to the present embodiment, in the second-type layer portion 10B, the plurality of electrodes are not electrically connected to the semiconductor chip 30. Consequently, the defective semiconductor chip 30 in the second-type layer portion 10B is not electrically connected to the plurality of wires W, and is thus disabled.

According to the present embodiment, if at least one of the subpackages 1S in the composite layered chip package 1 includes the second-type layer portion 10B, one or more additional portions 51 are added to form a composite layered chip package 1. Such a composite layered chip package 1 has the same functions as those of a composite layered chip package 1 that includes no defective semiconductor chip 30.

Suppose that in the composite layered chip package 1 shown in FIG. 1, the layer portion 10S1 of the subpackage 1A is the second-type layer portion 10B. In this case, as shown in FIG. 9, the additional portion 51S1 to substitute for the layer portion 10S1 is provided on the top of the subpackage 1A. Here, the plurality of second additional portion terminals 55 of the additional portion 51S1 are electrically connected to the plurality of first terminals 4 of the subpackage 1A. As with the layer portion 10S1 of the subpackage 1A, the electrodes 82D1 and 82D2 of the additional portion 51S1 are electrically connected to the wires WC1 and WC2 of the subpackage 1A, respectively. If the layer portion 10S2 of the subpackage 1A is the second-type layer portion 10B, the additional portion 51S2 is provided on the top of the subpackage 1A, instead of the additional portion 51S1. If the layer portion 10S1 or 10S2 of the subpackage 1A is the second-type layer portion 10B, the additional portion 51S1 or 51S2 may be provided on the bottom of the subpackage 1D.

Suppose that in the composite layered chip package 1 shown in FIG. 1, the layer portion 10S1 of the subpackage 1B is the second-type layer portion 10B. In this case, as shown in FIG. 10, the additional portion 51S1 to substitute for the layer portion 10S1 is provided on the top of the subpackage 1B, or in other words, between the subpackage 1A and the subpackage 1B. Here, the plurality of second additional portion terminals 55 of the additional portion 51S1 are electrically connected to the plurality of first terminals 4 of the subpackage 1B, and the plurality of first additional portion terminals 54 of the additional portion 51S1 are electrically connected to the plurality of second terminals 5 of the subpackage 1A. As with the layer portion 10S1 of the subpackage 1B, the electrodes 82D1 and 82D2 of the additional portion 51S1 are electrically connected to the wires WC1 and WC2 of the subpackage 1B, respectively. If the layer portion 10S2 of the subpackage 1B is the second-type layer portion 10B, the additional portion 51S2 is provided on the top of the subpackage 1B, instead of the additional portion 51S1.

Similarly, if the layer portion 10S1 or 10S2 of the subpackage 1C is the second-type layer portion 10B, the additional portion 51S1 or 51S2 is provided on the top of the subpackage 1C. If the layer portion 10S1 or 10S2 of the subpackage 1D is the second-type layer portion 10B, the additional portion 51S1 or 51S2 is provided on the top of the subpackage 1D.

If the subpackages 1A to 1D include two or more second-type layer portions 10B, two or more additional portions 51 are added to form a composite layered chip package 1 in accordance with the principle described above.

In any of the composite layered chip packages 1 having the foregoing configurations, the additional semiconductor chip 80 in the additional portion 51 is electrically connected to the plurality of wires W of the subpackages 1A to 1D via the additional portion wiring 53 so that the additional semiconductor chip 80 substitutes for a defective semiconductor chip 30.

Figure 12:
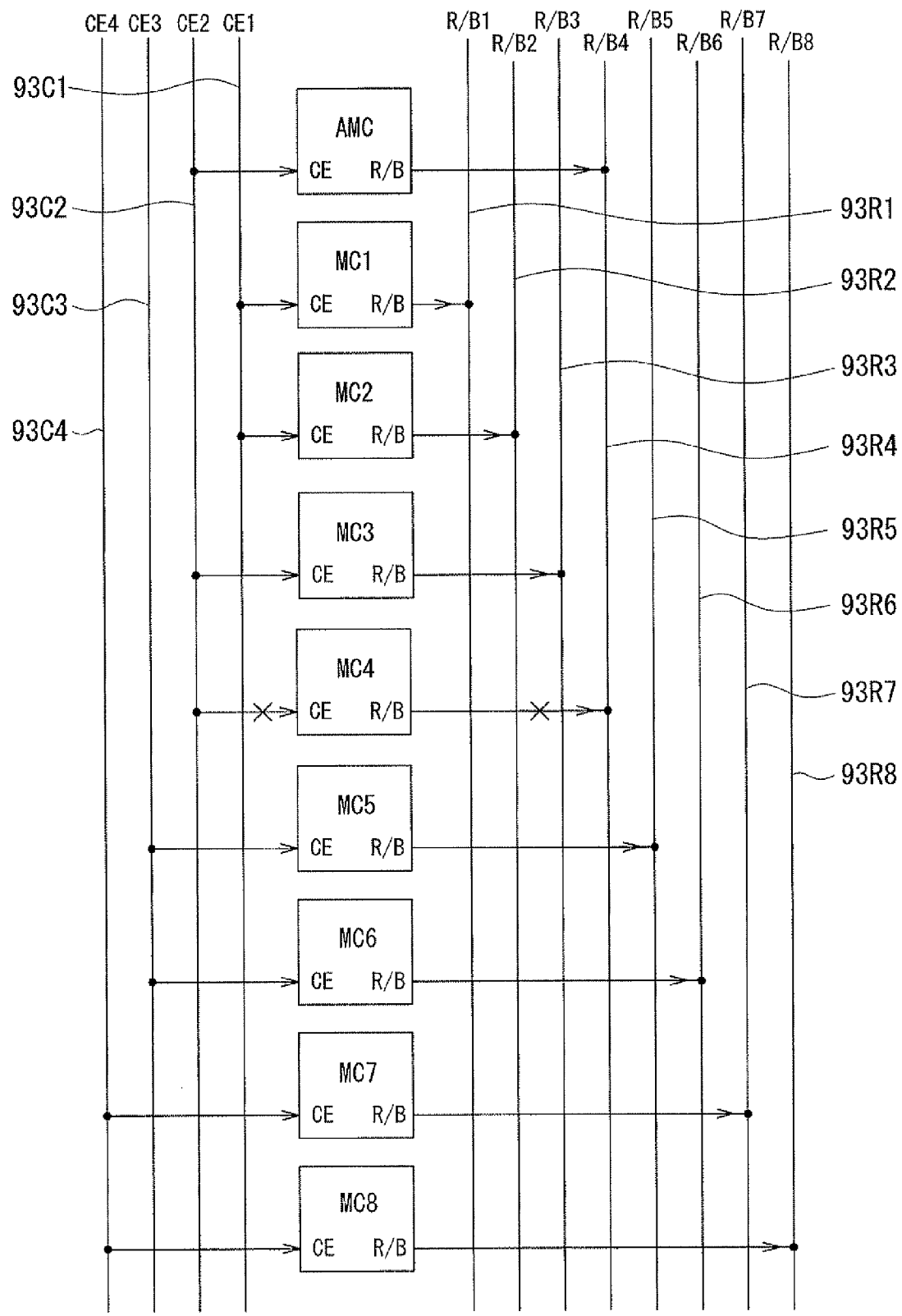
FIG. 12 is a block diagram showing a remedy for coping with situations where the memory device shown in FIG. 11 includes a defective semiconductor chip.

FIG. 11 shows a case where the composite layered chip package 1 includes no defective semiconductor chip 30 (memory chip). As one example, FIG. 12 shows a remedy for coping with the situation where the semiconductor chip 30 in the layer portion 10S2 of the subpackage 1B, i.e., the memory chip MC4, is defective. FIG. 12 shows the relationship between the plurality of memory chips and the signal lines 93C1 to 93C4 and 93R1 to 93R8.

The memory chip MC4 being defective, the plurality of electrodes in the layer portion 10S2 of the subpackage 1B are not electrically connected to the memory chip MC4. Consequently, the defective memory chip MC4 is not electrically connected to the plurality of wires W, and is thus disabled. In such a case, according to the present embodiment, the additional portion 51S2 to substitute for the layer portion 10S2 is provided on the top of the subpackage 1B to form a composite layered chip package 1.

In FIG. 12, the symbol AMC represents the memory chip that is the additional semiconductor chip 80 of the additional portion 51S2. The memory chip AMC is electrically connected to the plurality of wires W of the subpackage 1B via the additional portion wiring 53. In particular, the electrodes 82D1 and 82D2 of the additional portion 51S2 are electrically connected to the wires WC1 and WC3 of the subpackage 1B, respectively, as with the layer portion 10S2 of the subpackage 1B. Consequently, as shown in FIG. 12, the electrode pads CE and R/B of the memory chip AMC are electrically connected to the signal lines 93C2 and 93R4, respectively. The composite layered chip package 1 therefore has the same functions as those of a composite layered chip package 1 that includes no defective semiconductor chip 30 (memory chip).

Figure 13:
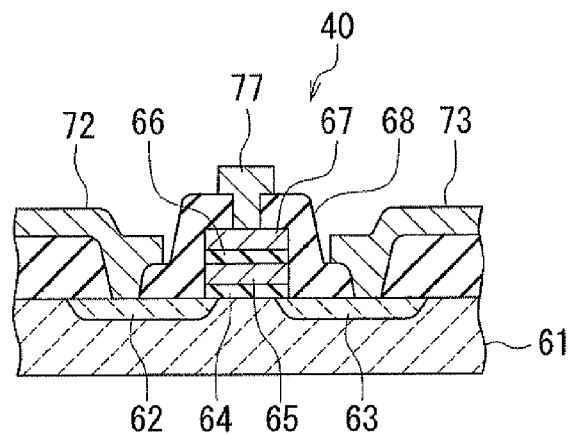
FIG. 13 is a cross-sectional view showing an example of a memory cell included in the semiconductor chip.

Reference is now made to FIG. 13 to describe an example of the configuration of the memory cells included in the semiconductor chip 30 (memory chip). The memory cell 40 shown in FIG. 13 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

A description will now be given of a method of manufacturing the layered chip package and a method of manufacturing the composite layered chip package 1 according to the present embodiment. The method of manufacturing the composite layered chip package 1 according to the embodiment includes the steps of: fabricating a plurality of subpackages 1S; and stacking the plurality of subpackages 1S and, for any two vertically adjacent subpackages 1S, electrically connecting the plurality of second terminals 5 of the upper subpackage 1S to the plurality of first terminals 4 of the lower subpackage 1S. The method of manufacturing the layered chip package according to the embodiment is a method by which a plurality of layered chip packages or a plurality of subpackages 1S are manufactured.

The step of fabricating the plurality of subpackages 1S includes, as a series of steps for forming each subpackage 1S, the steps of: fabricating a layered substructure by stacking two substructures each of which includes an array of a plurality of preliminary layer portions, each of the preliminary layer portions being intended to become either one of the layer portions 10 included in the main part 2M, the substructures being intended to be cut later at positions of boundaries between every adjacent preliminary layer portions; and forming the plurality of subpackages 1S from the layered substructure.

Figure 14:
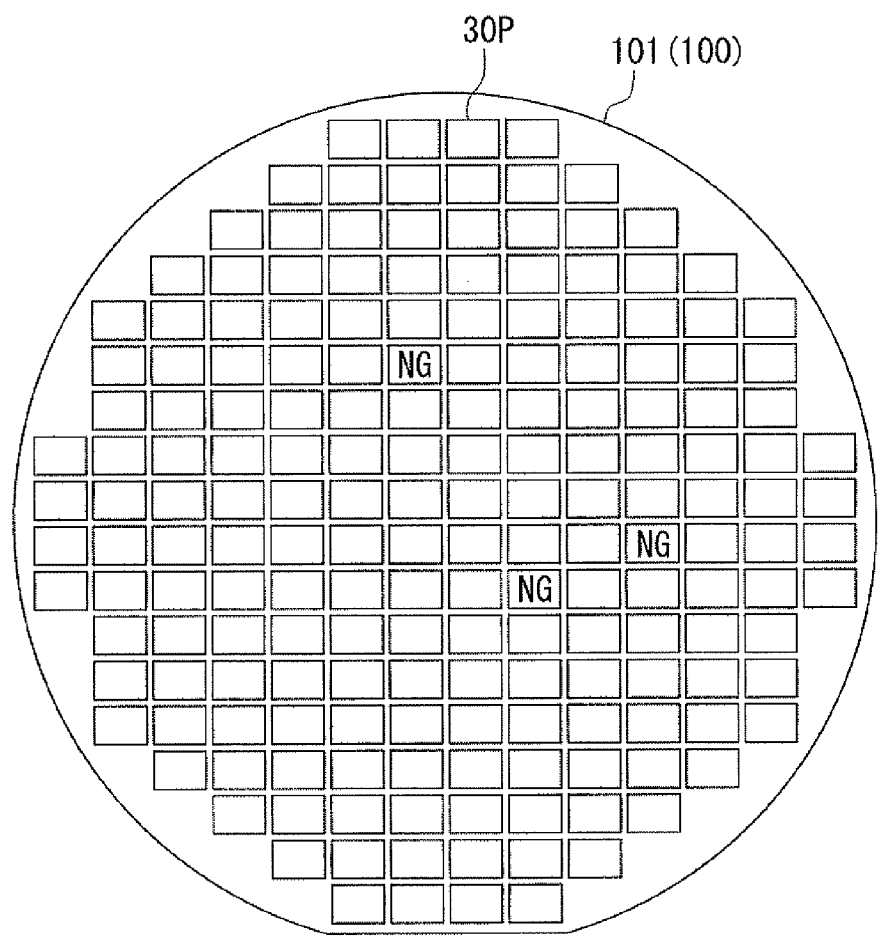
FIG. 14 is a plan view showing a pre-substructure wafer fabricated in a step of a method of manufacturing the composite layered chip package according to the first embodiment of the invention.
Figure 15:
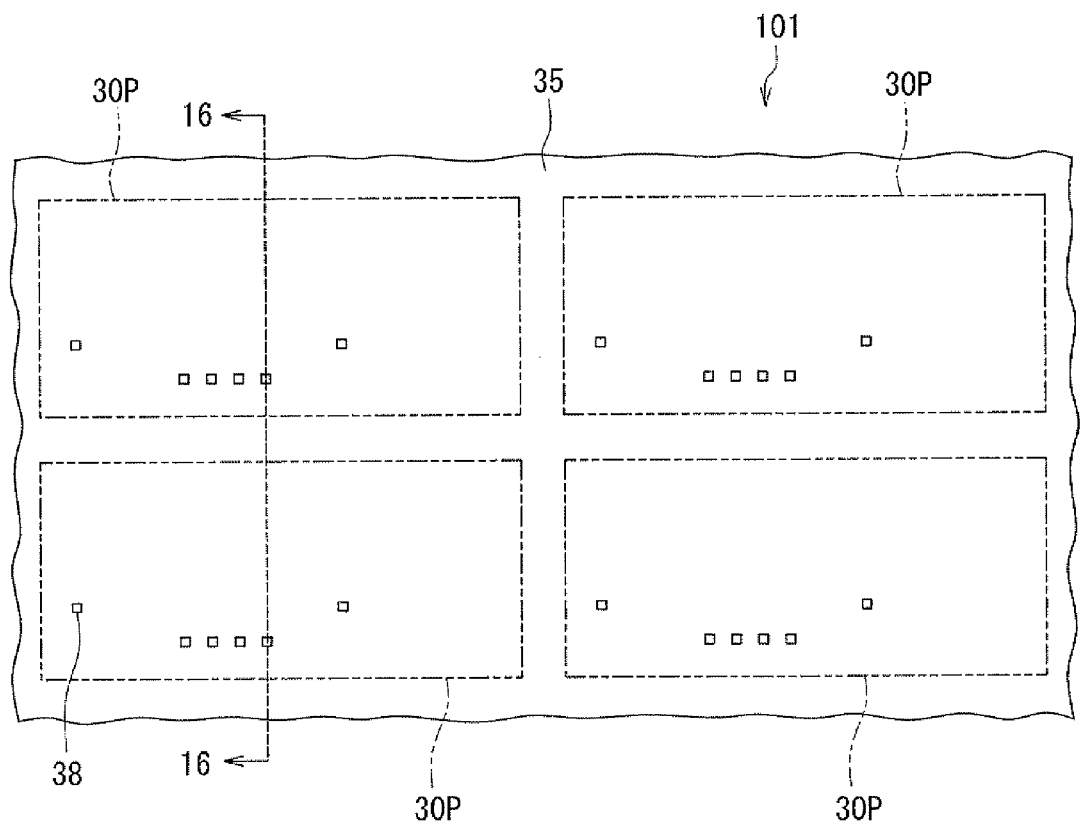
FIG. 15 is a magnified plan view of a part of the pre-substructure wafer shown in FIG. 14.
Figure 16:
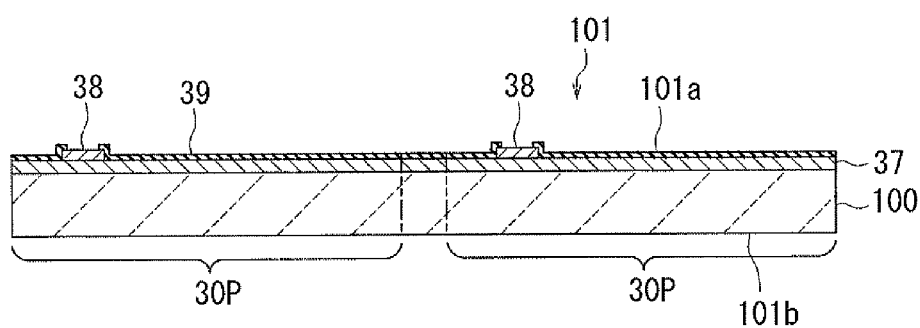
FIG. 16 shows a cross section taken along line 16-16 of FIG. 15.

The step of fabricating the layered substructure will now be described in detail with reference to FIG. 14 to FIG. 27. In the step of fabricating the layered substructure, a pre-substructure wafer 101 is initially fabricated. The pre-substructure wafer 101 includes an array of a plurality of pre-semiconductor-chip portions 30P that are intended to become individual semiconductor chips 30. FIG. 14 is a plan view of the pre-substructure wafer 101. FIG. 15 is a magnified plan view of a part of the pre-substructure wafer 101 shown in FIG. 14. FIG. 16 shows a cross section taken along line 16-16 of FIG. 15.

Specifically, in the step of fabricating the pre-substructure wafer 101, a semiconductor wafer 100 having two mutually opposite surfaces is subjected to processing, such as a wafer process, at one of the two surfaces. This forms the pre-substructure wafer 101 including an array of a plurality of pre-semiconductor-chip portions 30P, each of the pre-semiconductor-chip portions 30P including a device. In the pre-substructure wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-substructure wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 14 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 16, the pre-semiconductor-chip portions 30P include a device-forming region 37 that is formed near one of the surfaces of the semiconductor wafer 100. The device-forming region 37 is a region where devices are formed by processing the one of the surfaces of the semiconductor wafer 100. The pre-semiconductor-chip portions 30P further include a plurality of electrode pads 38 disposed on the device-forming region 37, and a passivation film 39 disposed on the device-forming region 37. The passivation film 39 is made of an insulating material such as phospho-silicate-glass (PSG), silicon nitride, or polyimide resin. The passivation film 39 has a plurality of openings for exposing the top surfaces of the plurality of electrode pads 38. The plurality of electrode pads 38 are located in the positions corresponding to the plurality of electrodes to be formed later, and are electrically connected to the devices formed in the device-forming region 37. Hereinafter, the surface of the pre-substructure wafer 101 located closer to the plurality of electrode pads 38 and the passivation film 39 will be referred to as a first surface 101a, and the opposite surface will be referred to as a second surface 101b.

In the step of fabricating the layered substructure, next, a wafer sort test is performed to distinguish the plurality of pre-semiconductor-chip portions 30P included in the pre-substructure wafer 101 into normally functioning pre-semiconductor-chip portions and malfunctioning pre-semiconductor-chip portions. In this step, a probe of a testing device is brought into contact with the plurality of electrode pads 38 of each pre-semiconductor-chip portion 30P so that whether the pre-semiconductor-chip portion 30P functions normally or not is tested with the testing device. In FIG. 14, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-substructure wafer 101. The location information is used in a step to be performed later. The passivation film 39 may be formed after the wafer sort test, and may thus be yet to be formed at the time of performing the wafer sort test.

Figure 17:
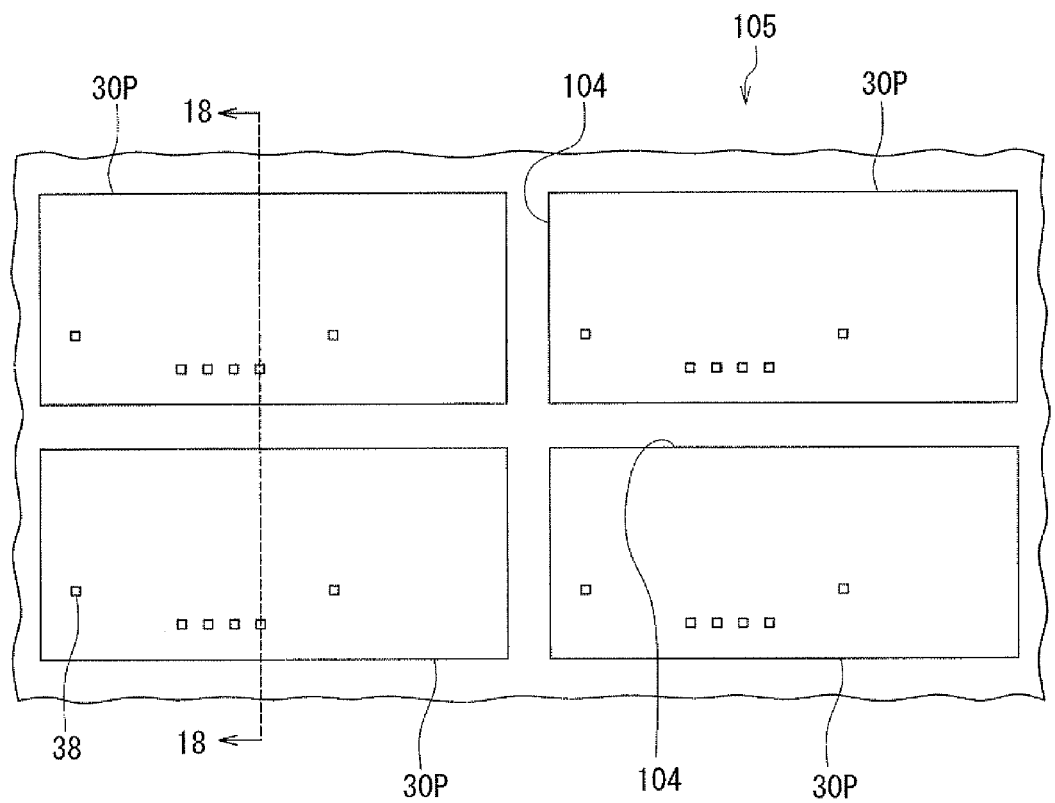
FIG. 17 is a plan view showing a step that follows the step shown in FIG. 15.
Figure 18:
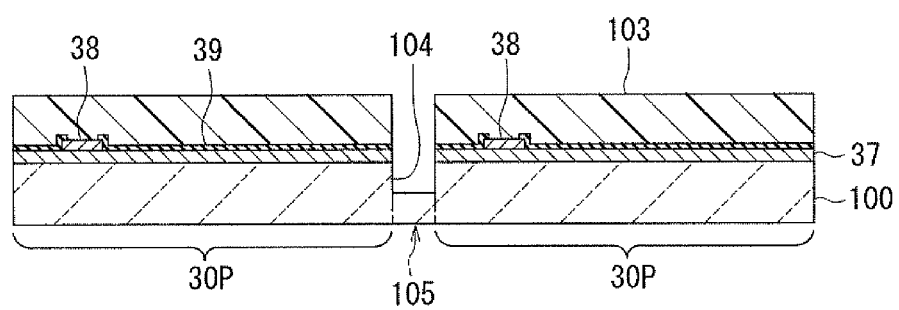
FIG. 18 shows a cross section taken along line 18-18 of FIG. 17.

FIG. 17 is a plan view showing a step that follows the step shown in FIG. 15. FIG. 18 shows a cross section taken along line 18-18 of FIG. 17. In this step, a protection layer 103 is initially formed to cover the first surface 101a of the pre-substructure wafer 101. The protection layer 103 is formed of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is omitted in FIG. 17.

In the positions of the boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 µm, for example. The grooves 104 have a depth in the range of 20 to 80 µm, for example.

The grooves 104 may be formed using a dicing saw or by performing etching, for example. The etching may be reactive ion etching or anisotropic wet etching using KOH as the etching solution, for example. When forming the grooves 104 by etching, the protection layer 103 made of photoresist may be patterned by photolithography to form the etching mask. The protection layer 103 is removed after the formation of the grooves 104. A pre-polishing substructure main body 105 is thus formed by the pre-substructure wafer 101 with the plurality of grooves 104 formed therein.

Figure 19:
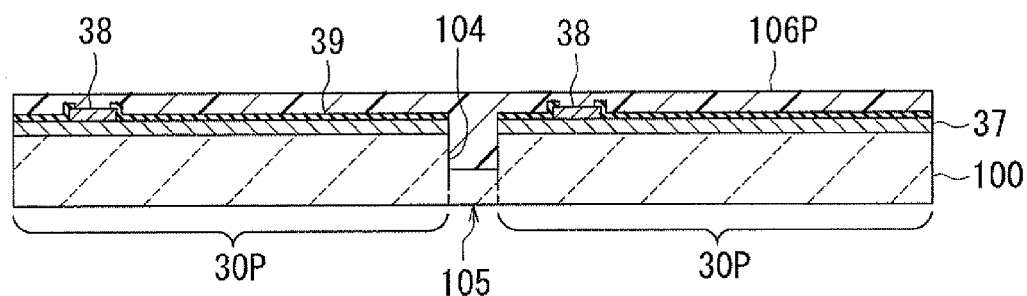
FIG. 19 is a cross-sectional view showing a step that follows the step shown in FIG. 18.

FIG. 19 shows a step that follows the step shown in FIG. 18. In this step, an insulating film 106P is formed to fill the plurality of grooves 104 of the pre-polishing substructure main body 105 and to cover the plurality of electrode pads 38 and the passivation film 39. The insulating film 106P is to become a part of the insulating portion 31 later. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

The insulating film 106P is preferably formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104 and a second layer that covers the first layer, the plurality of electrode pads 38 and the passivation film 39. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP), before forming the second layer on the first layer.

If the passivation film 39 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 38 are not formed in the second layer as initially formed.

Figure 20:
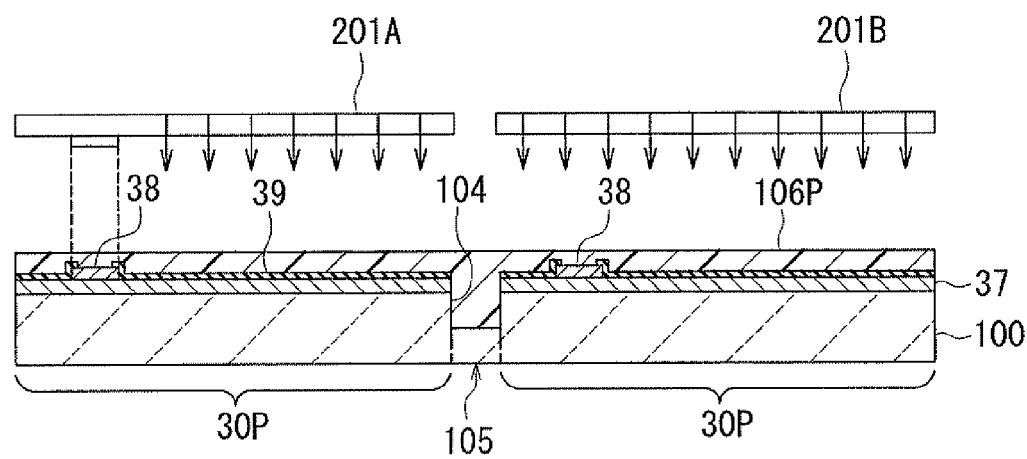
FIG. 20 is a cross-sectional view showing a step that follows the step shown in FIG. 19.
Figure 21:
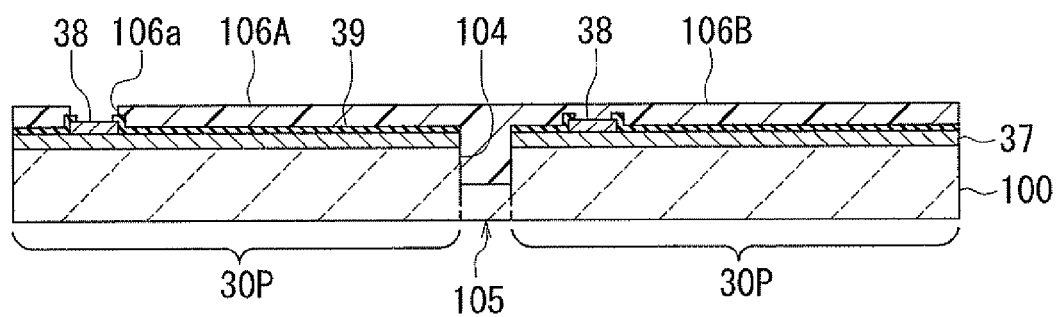
FIG. 21 is a cross-sectional view showing a step that follows the step shown in FIG. 20.

Reference is now made to FIG. 20 and FIG. 21 to describe the step of forming the plurality of openings for exposing the plurality of electrode pads 38 in the insulating film 106P in the normally-functioning pre-semiconductor-chip portions 30P. FIG. 20 shows a step that follows the step shown in FIG. 19. FIG. 21 shows a step that follows the step shown in FIG. 20.

Here, a description will initially be given of a case where either the entire insulating film 106P or the second layer of the insulating film 106P is formed of a negative photosensitive material and photolithography is employed to form the openings in the insulating film 106P. In this case, all the pre-semiconductor-chip portions 30P are simultaneously subjected to the exposure of the insulating film 106P by using a mask 201A shown in FIG. 20. The mask 201A has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed in the malfunctioning pre-semiconductor-chip portions 30P only, using a mask 201B shown in FIG. 20. This exposure process uses the location information on the normally functioning pre-semiconductor-chip portions 30P and the malfunctioning pre-semiconductor-chip portions 30P in each pre-substructure wafer 101 which was obtained by the wafer sort test. In FIG. 20, the pre-semiconductor-chip portion 30P on the left is a normally functioning one, whereas the pre-semiconductor-chip portion 30P on the right is a malfunctioning one. The mask 201B entirely transmits light. As a result of this exposure process, the entire insulating film 106P in the malfunctioning pre-semiconductor-chip portions 30P becomes insoluble in the developing solution.

Next, the insulating film 106P is developed with the developing solution. As a result, as shown in FIG. 21, a plurality of openings 106a for exposing the plurality of electrode pads 38 are formed in the insulating film 106P in the normally functioning pre-semiconductor-chip portion 30P (the left side). On the other hand, no openings 106P are formed in the insulating film 106P in the malfunctioning pre-semiconductor-chip portion 30P (the right side). After the development, the area of the insulating film 106P corresponding to the normally functioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 38, and is disposed around the plurality of electrode pads 38. The second-type insulating layer 106B covers the plurality of electrode pads 38 so as to avoid exposure.

Now, an example of the method for forming the plurality of openings 106a in the insulating film 106P will be described for the case where either the entire insulating film 106P or the second layer of the insulating film 106P is formed of a non-photosensitive material. In the example, a negative photoresist layer is initially formed on the insulating film 106P. The photoresist layer is then exposed and developed by the same method as with the exposure and development of the foregoing insulating film 106P. Consequently, in the normally functioning pre-semiconductor-chip portions 30P, a plurality of openings are formed in the photoresist layer at positions corresponding to the plurality of electrode pads 38. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 22:
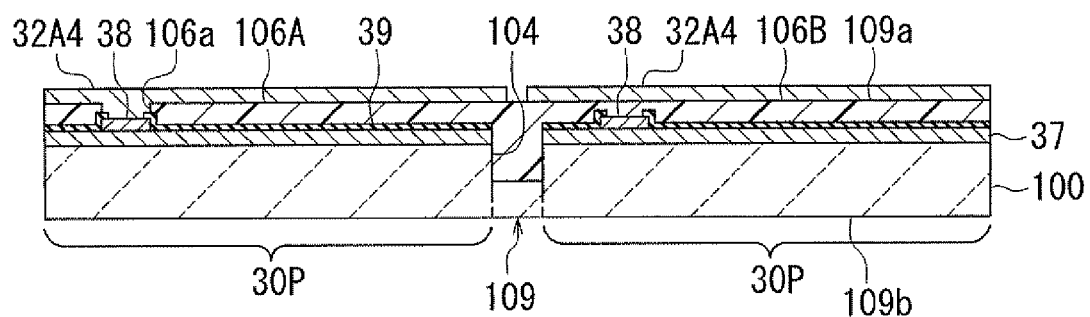
FIG. 22 is a cross-sectional view showing a step that follows the step shown in FIG. 21.
Figure 23:
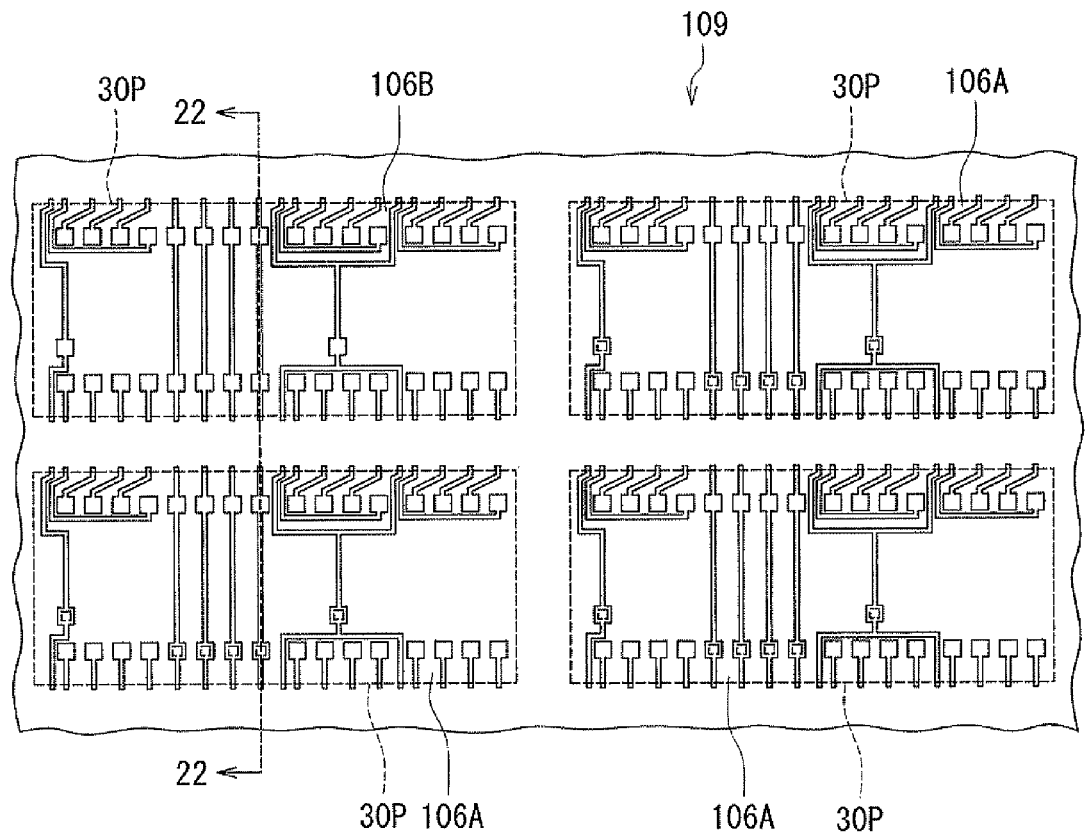
FIG. 23 is a plan view showing the step of FIG. 22.

FIG. 22 and FIG. 23 show a step that follows the step shown in FIG. 21. In this step, the plurality of electrodes are formed on the insulating layers 106A and 106B by plating, for example. In each of the normally functioning pre-semiconductor-chip portions 30P, the first-type electrodes 32A1 to 32A4 and the sixth-type electrodes 32D1 and 32D2 among the plurality of electrodes are in contact with and electrically connected to the respective corresponding electrode pads 38 through the plurality of openings 106a of the insulating layer 106A. In each of the normally functioning pre-semiconductor-chip portions 30P, the plurality of electrodes other than the first-type and sixth-type electrodes are not in contact with the pre-semiconductor-chip portion 30P. In each of the malfunctioning pre-semiconductor-chip portions 30P, on the other hand, none of the electrodes are in contact with the pre-semiconductor-chip portion 30P since no openings 106a are formed in the insulating layer 106B.

In this way, there is fabricated a pre-polishing substructure 109 shown in FIG. 22 and FIG. 23. The pre-polishing substructure 109 has a first surface 109a corresponding to the first surface 101a of the pre-substructure wafer 101, and a second surface 109b corresponding to the second surface 101b of the pre-substructure wafer 101.

The electrodes are formed of a conductive material such as Cu. In the case of forming the electrodes by plating, a seed layer for plating is initially formed. Next, a photoresist layer is formed on the seed layer. The photoresist layer is then patterned by photolithography to form a frame that has a plurality of openings in which the electrodes are to be accommodated later. Next, plating layers that are intended to constitute respective portions of the electrodes are formed by plating on the seed layer in the openings of the frame. The plating layers have a thickness in the range of 5 to 15 µm, for example. Next, the frame is removed, and portions of the seed layer other than those lying under the plating layers are also removed by etching. The plating layers and the remaining portions of the seed layer under the plating layers thus form the electrodes.

Figure 24:
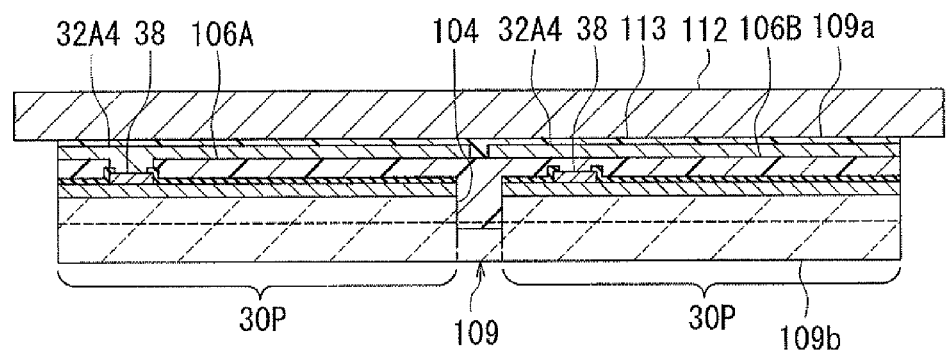
FIG. 24 is a cross-sectional view showing a step that follows the step shown in FIG. 22.

FIG. 24 shows a step that follows the step shown in FIG. 22. In this step, using an insulating adhesive, the pre-polishing substructure 109 is bonded to a plate-shaped jig 112 shown in FIG. 24, with the first surface 109a of the pre-polishing substructure 109 arranged to face a surface of the jig 112. In FIG. 24, the reference numeral 113 indicates an insulating layer formed by the adhesive. The insulating layer 113 is to become part of the insulating portion 31 later.

Figure 25:
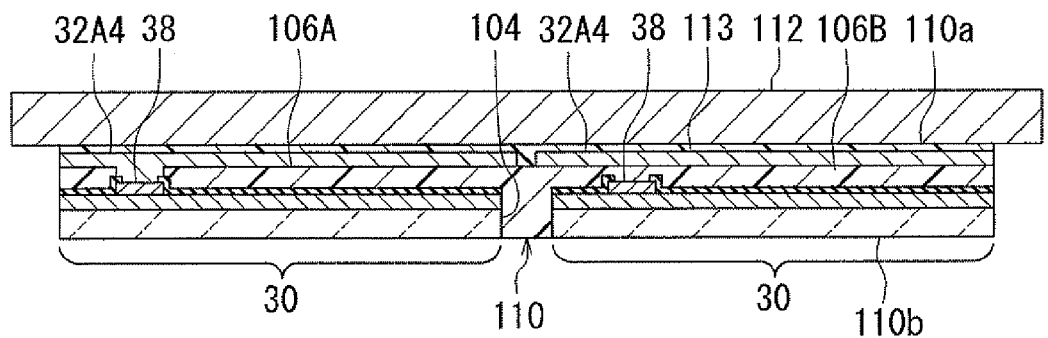
FIG. 25 is a cross-sectional view showing a step that follows the step shown in FIG. 24.

FIG. 25 shows a step that follows the step shown in FIG. 24. In this step, the second surface 109b of the pre-polishing substructure 109 bonded to the jig 112 is polished. The polishing is performed until the plurality of grooves 104 are exposed. The broken line in FIG. 24 indicates the level of the second surface 109b after the polishing. By polishing the second surface 109b of the pre-polishing substructure 109, the pre-polishing substructure 109 is thinned. Consequently, there is formed a substructure 110 in the state of being bonded to the jig 112. The substructure 110 has a thickness of 20 to 80 µm, for example. The substructure 110 has a first surface 110a corresponding to the first surface 109a of the pre-polishing substructure 109, and a second surface 110b opposite to the first surface 110a. The second surface 110b is the polished surface. By polishing the second surface 109b of the pre-polishing substructure 109 until the plurality of grooves 104 are exposed, the plurality of pre-semiconductor-chip portions 30P are separated from each other into individual semiconductor chips 30.

Figure 26:
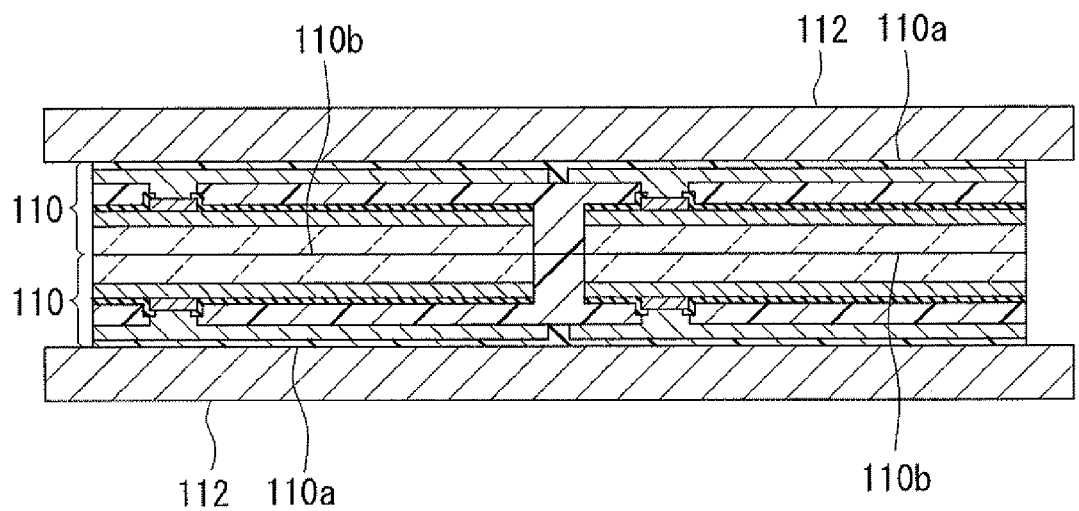
FIG. 26 is a cross-sectional view showing a step that follows the step shown in FIG. 25.

FIG. 26 shows a step that follows the step shown in FIG. 25. In this step, two substructures 110 bonded to the respective jigs 112 are bonded to each other with an insulating adhesive, with the respective second surfaces 110b arranged to face each other, whereby a stack of two substructures 110 is fabricated.

Figure 27:
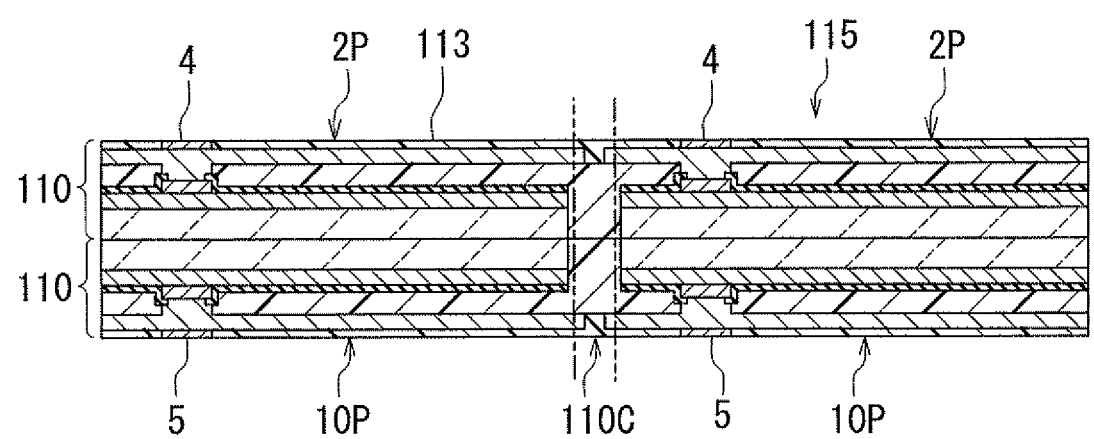
FIG. 27 is a cross-sectional view showing a part of a first layered substructure fabricated in a step that follows the step shown in FIG. 26.

FIG. 27 shows a step that follows the step shown in FIG. 26. In this step, the two jigs 112 are initially removed from the stack of two substructures 110. Next, the insulating layer 113 is partially removed from each of the substructures 110 by, for example, etching, so that the first and second terminal component parts of the plurality of electrodes are exposed to form a plurality of conductor pads. Next, a plurality of conductor layers are formed on the plurality of conductor pads, whereby the plurality of first terminals 4 and the plurality of second terminals 5 are formed.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 µm, for example. The solder layer is formed on the surface of each of the electrodes directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

In this way, there is formed a first layered substructure 115 including two substructures 110 stacked, as shown in FIG. 27. Each of the substructures 110 includes an array of a plurality of preliminary layer portions 10P. Each of the preliminary layer portions 10P is to become either one of the layer portions 10 included in the main part 2M of the main body 2. The substructures 110 are to be cut later in the positions of the boundaries between every adjacent preliminary layer portions 10P. In FIG. 27, the reference symbol 110C indicates the cutting positions in the substructures 110. The first layered substructure 115 includes an array of a plurality of pre-separation main bodies 2P that are to be separated from each other into individual main bodies 2 later. Each single pre-separation main body 2P includes two preliminary layer portions 10P.

Now, the process for forming a plurality of subpackages by using the first layered substructure 115 will be described in detail with reference to FIG. 28 to FIG. 38.

Figure 28:
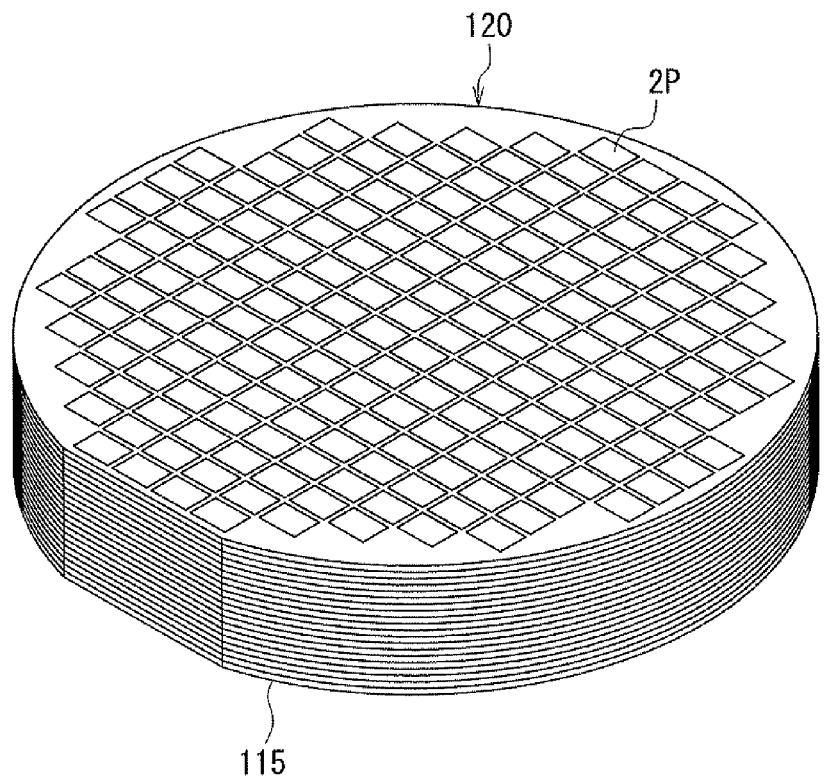
FIG. 28 is a perspective view showing a second layered substructure fabricated in a step that follows the step shown in FIG. 27.
Figure 29:
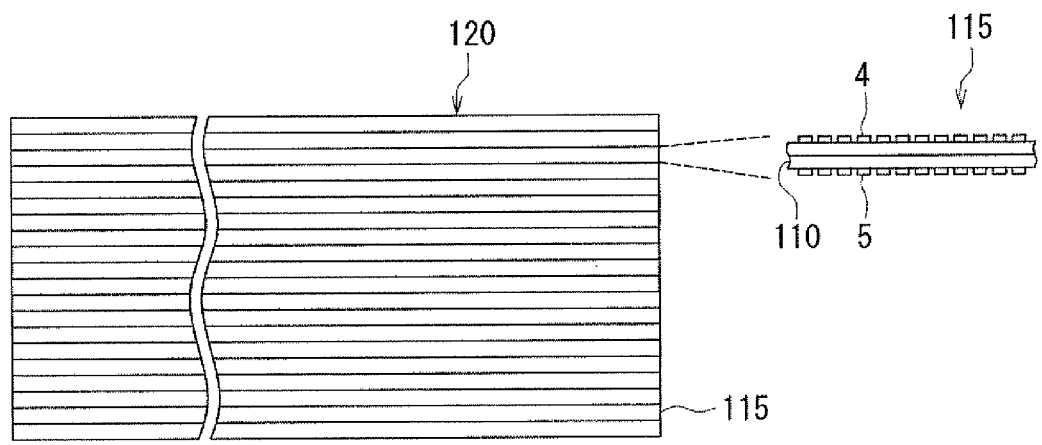
FIG. 29 is a side view of the second layered substructure shown in FIG. 28.

FIG. 28 and FIG. 29 show a step that follows the step shown in FIG. 27. In this step, a plurality of first layered substructures 115 are stacked and every two vertically adjacent first layered substructures 115 are bonded to each other, whereby a second layered substructure 120 is fabricated. FIG. 28 and FIG. 29 show an example where 20 first layered substructures 115 are stacked to fabricate the second layered substructure 120. Every two vertically adjacent first layered substructures 115 are bonded to each other with an adhesive so as to be easily detachable. In this example, as shown in FIG. 29, the second layered substructure 120 includes 20 first layered substructures 115 stacked, each of the first layered substructures 115 including two substructures 110 stacked. That is, the second layered substructure 120 includes 40 substructures 110 stacked. Suppose that each individual substructure 110 has a thickness of 50 µm. Ignoring the thickness of the adhesive that bonds the two substructures 110 to each other and the thickness of the adhesive that bonds every two vertically adjacent first layered substructures 115 to each other, the second layered substructure 120 has a thickness of 50 μm×40, i.e., 2 mm.

Figure 30:
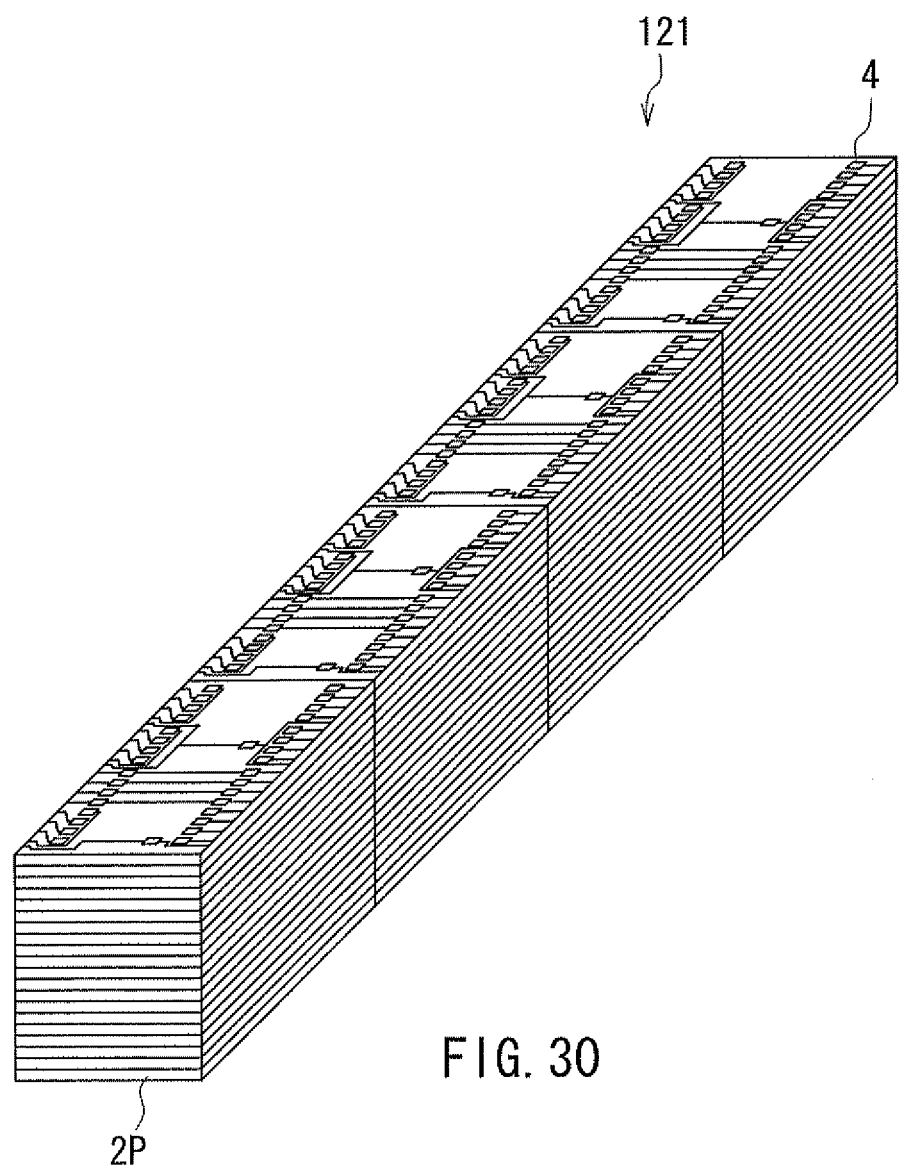
FIG. 30 is a perspective view showing an example of a block obtained by cutting the second layered substructure.

FIG. 30 shows a step that follows the step shown in FIG. 28 and FIG. 29. In this step, the second layered substructure 120 is cut into at least one block 121 in which a plurality of pre-separation main bodies 2P are arranged both in the direction of stacking of the first layered substructures 115 and in a direction orthogonal thereto. FIG. 30 shows an example of the block 121. In the block 121 shown in FIG. 30, 20 pre-separation main bodies 2P are arranged in the direction of stacking of the first layered substructures 115, and four are arranged in the direction orthogonal to the direction of stacking of the first layered substructures 115. In this example, the block 121 includes 80 pre-separation main bodies 2P.

Figure 31:
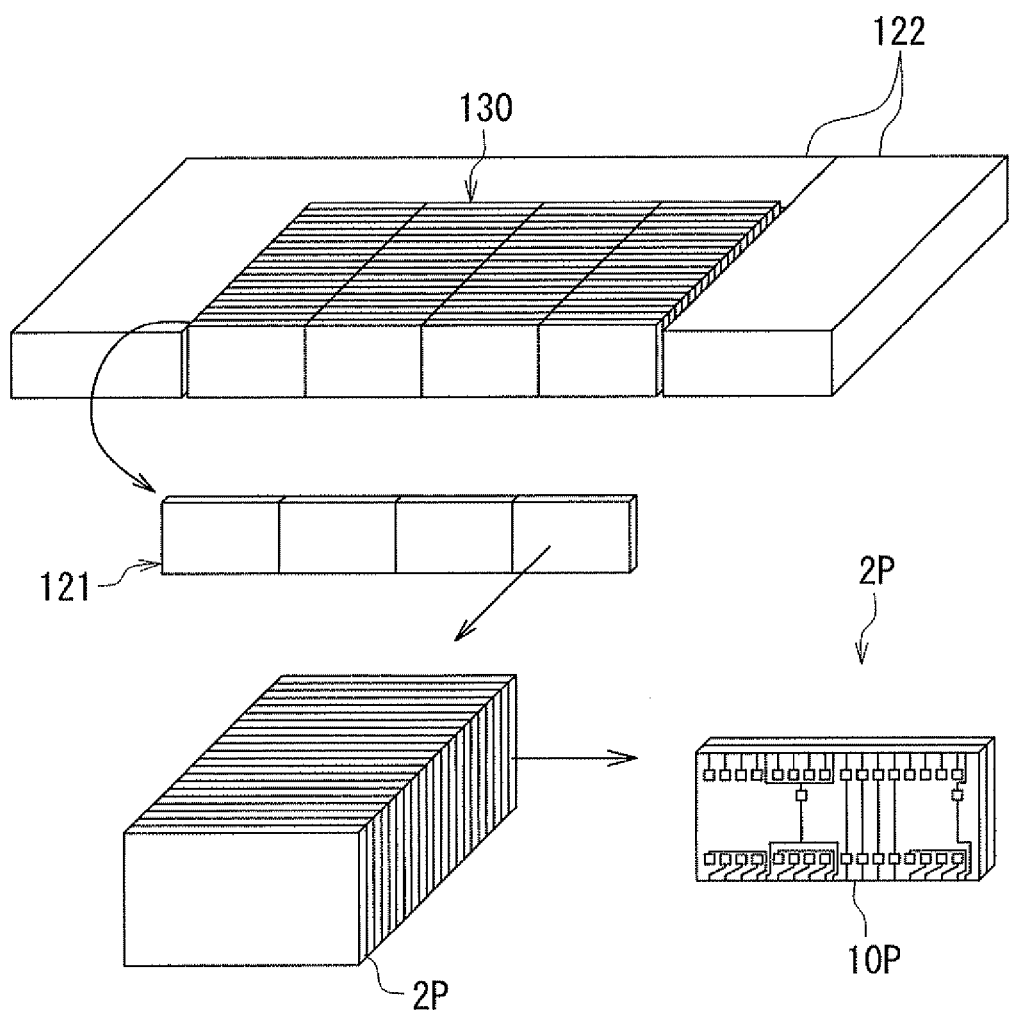
FIG. 31 is an explanatory diagram showing a step that follows the step shown in FIG. 30.

FIG. 31 shows a step that follows the step shown in FIG. 30. In this step, a plurality of jigs 122 are used to arrange two or more blocks 121 to form a block assembly 130. The plurality of jigs 122 are combined to form a frame for surrounding the block assembly 130. FIG. 31 shows an example where 19 blocks 121 shown in FIG. 30 are arranged to form the block assembly 130. In this example, the block assembly 130 includes 19 blocks 121, each of the blocks 121 includes 80 pre-separation main bodies 2P, and each of the pre-separation main bodies 2P includes two preliminary layer portions 10P. That is, the block assembly 130 includes 19×80, i.e., 1520 pre-separation main bodies 2P, and 19×80×2, i.e., 3040 preliminary layer portions 10P. All the pre-separation main bodies 2P included in the block assembly 130 are arranged so that their respective surfaces on which the wiring 3 is to be formed later face toward the same direction, i.e., upward.

Figure 32:
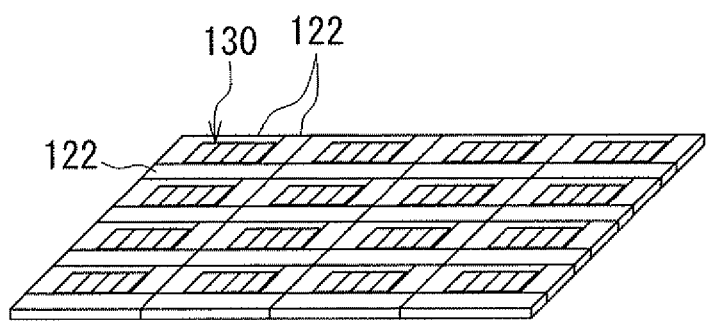
FIG. 32 is a perspective view showing a plurality of block assemblies that are arranged in a step that follows the step shown in FIG. 31.

FIG. 32 shows a step that follows the step shown in FIG. 31. In this step, a plurality of block assemblies 130 are arranged in one plane by using a plurality of jigs 122. Here, all the pre-separation main bodies 2P included in the plurality of block assemblies 130 are arranged so that their respective surfaces on which the wiring 3 is to be formed later face toward the same direction, i.e., upward. FIG. 32 shows an example where 16 block assemblies 130 are arranged in one plane. In such a case, the 16 block assemblies 130 include 1520×16, i.e., 24320 pre-separation main bodies 2P, and 3040×16, i.e., 48640 preliminary layer portions 10P.

In the present embodiment, the wiring 3 is then simultaneously formed on all the pre-separation main bodies 2P that are included in the plurality of block assemblies 130 arranged as shown in FIG. 32. The step of forming the wiring 3 will be described with reference to FIG. 33 to FIG. 37.

Figure 33:
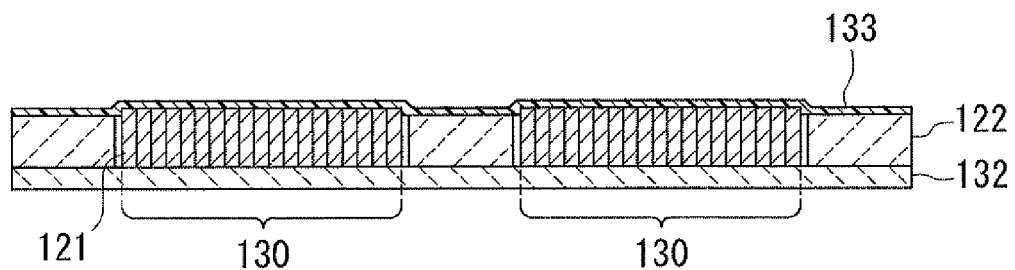
FIG. 33 is a cross-sectional view showing a step of the process for forming wiring in the first embodiment of the invention.

In the step of forming the wiring 3, as shown in FIG. 33, the plurality of jigs 122 and the plurality of block assemblies 130 shown in FIG. 32 are placed on a flat top surface of a jig 132. The plurality of block assemblies 130 are thereby arranged in one plane. When in such a state, the top surfaces of the jigs 122 are at a level slightly lower than that of the top surfaces of the block assemblies 130.

In the step of forming the wiring 3, a resin layer 133 is then formed to cover the top surfaces of the jigs 122 and the top surfaces of the block assemblies 130. The resin layer 133 may be formed by applying an uncured resin and then curing the resin, or by using a dry film.

Figure 34:
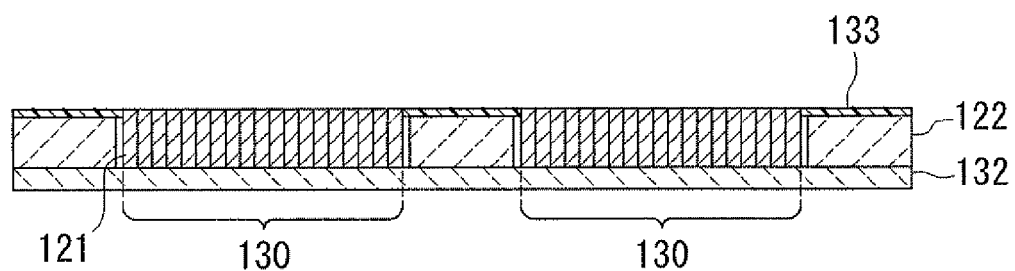
FIG. 34 is a cross-sectional view showing a step that follows the step shown in FIG. 33.

FIG. 34 shows a step that follows the step shown in FIG. 33. In this step, the resin layer 133 is polished by, for example, CMP, until the top surfaces of the plurality of block assemblies 130 are exposed. The top surfaces of the plurality of block assemblies 130 and the top surface of the resin layer 133 are thereby made even with each other.

Figure 35:
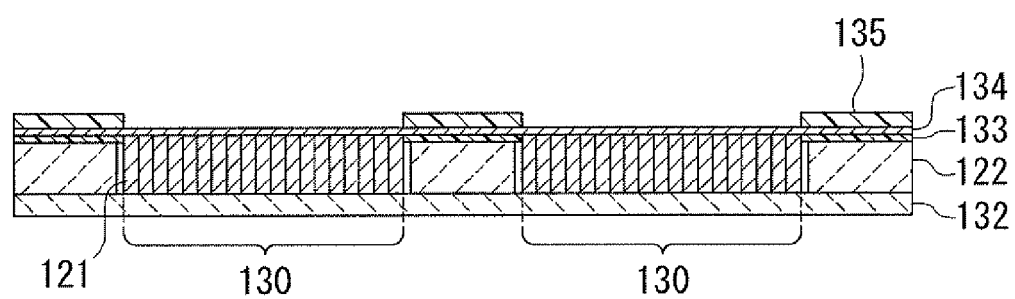
FIG. 35 is a cross-sectional view showing a step that follows the step shown in FIG. 34.

FIG. 35 shows a step that follows the step shown in FIG. 34. In this step, a seed layer 134 for plating is initially formed over the top surfaces of the plurality of block assemblies 130 and the resin layer 133. Next, a photoresist layer is formed on the seed layer 134. The photoresist layer is then patterned by photolithography to form a frame 135. The frame 135 has a plurality of openings in which a plurality of units of wiring 3 corresponding to the plurality of pre-separation main bodies 2P are to be accommodated later. Although not shown in FIG. 35, the frame 135 includes a plurality of portions located above the respective surfaces of all the pre-separation main bodies 2P included in the plurality of block assemblies 130 on which the wiring 3 is to be formed. These plurality of portions have the respective openings to accommodate the wiring 3 later.

Figure 36:
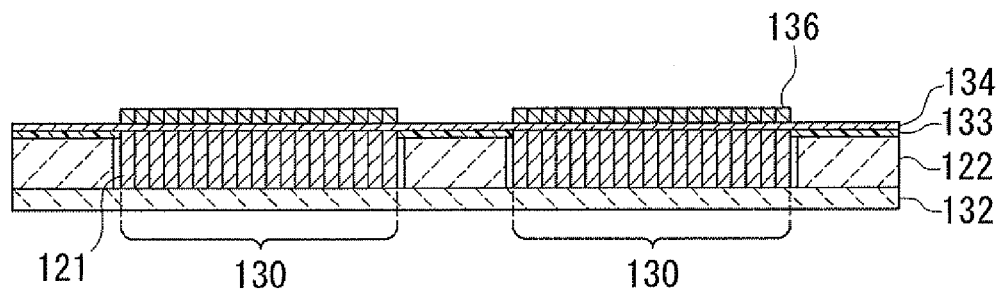
FIG. 36 is a cross-sectional view showing a step that follows the step shown in FIG. 35.

FIG. 36 shows a step that follows the step shown in FIG. 35. In this step, a plating layer 136 to constitute part of the wiring 3 is initially formed in each of the openings of the frame 135 by plating. Next, the frame 135 is removed. For the sake of convenience, FIG. 36 shows the plating layer 136 in a rectangular shape for each of the blocks 121. Actually, however, the plating layer 136 is formed in a shape corresponding to the wiring 3 for each of the pre-separation main bodies 2P.

Figure 37:
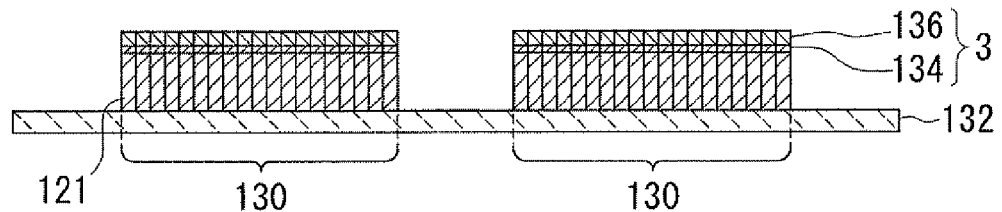
FIG. 37 is a cross-sectional view showing a step that follows the step shown in FIG. 36.

FIG. 37 shows a step that follows the step shown in FIG. 36. In this step, portions of the seed layer 134 other than those lying under the plating layers 136 are initially removed by etching. The plating layers 136 and the remaining portions of the seed layer 134 under the plating layers 136 thus form the wiring 3. The wiring 3 is formed on each of the pre-separation main bodies 2P. Next, the jigs 122 and the resin layer 133 remaining on the jigs 122 are removed.

Figure 38:
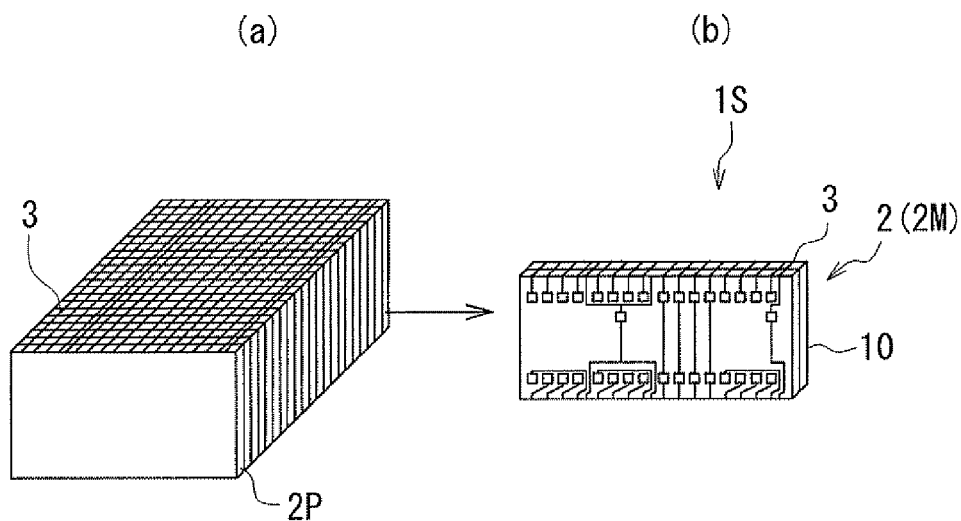
FIG. 38 is an explanatory diagram showing a step that follows the step shown in FIG. 37.

The process for forming a plurality of subpackages 1S then proceeds to the step of separating the plurality of pre-separation main bodies 2P from each other. Here, the pre-separation main bodies 2P each provided with the wiring 3 are separated from each other so that the plurality of subpackages 1S are formed. This step will be described with reference to FIG. 38. In the step, the block 121 is initially cut in the positions of the boundaries between every two pre-separation main bodies 2P that are adjacent to each other in the direction orthogonal to the direction of stacking of the pre-separation main bodies 2P. This produces a plurality of stacks shown in portion (a) of FIG. 38. Each of the stacks includes a plurality of pre-separation main bodies 2P stacked. In each of the stacks, every two adjacent pre-separation main bodies 2P are easily detachably bonded to each other by the adhesive that was used to bond every two vertically adjacent first layered substructures 115 when fabricating the second layered substructure 120 in the step shown in FIG. 28 and FIG. 29. Next, the plurality of pre-separation main bodies 2P included in the stack shown in portion (a) of FIG. 38 are separated from each other. This makes the pre-separation main bodies 2P into main bodies 2, whereby a plurality of subpackages 1S, each of which includes the main body 2 and the wiring 3, are formed. Portion (b) of FIG. 38 shows one of the subpackages 1S.

A plurality of subpackages 1S are thus formed through the series of steps that have been described with reference to FIG. 14 to FIG. 38. In the present embodiment, a structure composed of a single substructure 110 with a plurality of second additional portion terminals 55 formed on its bottom surface may be fabricated instead of the first layered substructure 115, and such a structure may be used instead of the first layered substructure 115 to form a plurality of packages each of which includes only a single layer portion 10, through the series of steps described with reference to FIG. 28 to FIG. 38. It is thereby possible to form a plurality of additional portions 51 such as ones shown in FIG. 6 to FIG. 8.

If the composite layered chip package 1 does not include any additional portion 51, the method of manufacturing the composite layered chip package 1 according to the present embodiment includes the steps of: fabricating a plurality of subpackages 1S; and stacking the plurality of subpackages 1S and electrically connecting them to each other.

If the composite layered chip package 1 includes the additional portion 51, the method of manufacturing the composite layered chip package 1 according to the present embodiment includes the steps of: fabricating a plurality of subpackages 1S; fabricating the additional portion 51; and stacking the plurality of subpackages 1S and the additional portion 51 and electrically connecting them to each other.

As has been described, the subpackage 1S or the layered chip package according to the present embodiment includes the wiring 3 that includes the plurality of wires W disposed on at least one of the side surfaces of the main body 2. The main body 2 includes the plurality of first terminals 4 disposed on the top surface 2Ma of the main part 2M, and the plurality of second terminals 5 disposed on the bottom surface 2Mb of the main part 2M. Both the plurality of first terminals 4 and the plurality of second terminals 5 are electrically connected to the plurality of wires W. With the subpackage 1S of such a configuration, electrical connection between two or more subpackages 1S can be established by stacking the two or more subpackages 1S and electrically connecting the second terminals 5 of the upper one of two vertically adjacent subpackages 1S to the first terminals 4 of the lower one. It is thereby possible to form the composite layered chip package 1 according to the present embodiment.

In the present embodiment, the plurality of first terminals 4 are formed by using the plurality of electrodes of the first layer portion 10S1, while the plurality of second terminals 5 are formed by using the plurality of electrodes of the second layer portion 10S2. According to the present embodiment, the electrical connection between a plurality of layered chip packages (subpackages 1S) can thus be achieved with simple configuration. Consequently, according to the present embodiment, a plurality of layered chip packages (subpackages 1S) can be stacked on each other and electrically connected to each other with simple configuration. This makes it possible to implement a package including a desired number of semiconductor chips 30 at low cost.

In the present embodiment, the plurality of electrodes of the first layer portion 10S1 and those of the second layer portion 10S2 have the same layout. The plurality of electrodes include a plurality of first terminal component parts that are used to form the plurality of first terminals 4 in the first layer portion 10S1, and a plurality of second terminal component parts that are used to form the plurality of second terminals 5 in the second layer portion 10S2. According to the present embodiment, different areas of the plurality of electrodes of the same layout can thus be used to form the first terminals 4 and the second terminals 5 of different layouts. This can further reduce the manufacturing costs of the subpackages 1S and the composite layered chip package 1.

In each subpackage 1S, the first layer portion 10S1 and the second layer portion 10S2 are bonded to each other such that the respective second surfaces 30b face each other. In the first layered substructure 115 which is fabricated in the process of manufacturing the subpackages 1S, two substructures 110 are bonded to each other with their second surfaces 110b arranged to face each other. If there is a stress that acts to warp each individual substructure 110, the stress can be cancelled out between the two substructures 110 in the first layered substructure 115. According to the present embodiment, it is therefore possible to maintain the flatness of the two substructures 110 included in the first layered substructure 115.

Each subpackage 1S includes a plurality of pairs of the first terminal 4 and the second terminal 5, the first and second terminals 4 and 5 being electrically connected to each other by the wires W. The plurality of pairs include the plurality of non-overlapping terminal pairs. As has been described in detail, according to the present embodiment, when a plurality of subpackages 1S having the same configuration are stacked on each other and electrically connected to each other, some of the plurality of signals associated with the semiconductor chips 30 that fall on the same layers in the respective plurality of subpackages 1S can be easily made different from one subpackage 1S to another. According to the present embodiment, it is therefore possible to stack a plurality of subpackages 1S of the same configuration and give the subpackages 1S respective different functions.

According to the present embodiment, a composite layered chip package 1 including a predetermined number of semiconductor chips 30 is formed by stacking a plurality of subpackages 1S. This makes it possible to reduce the number of semiconductor chips 30 to be included in a single subpackage 1S. It is thereby possible to reduce the possibility for a single subpackage 1S to include a defective semiconductor chip 30. According to the present embodiment, a composite layered chip package 1 including no defective semiconductor chip 30 can thus be easily formed by stacking subpackages 1S that each include only conforming semiconductor chips 30. According to the present embodiment, in particular, it is possible to make the possibility even lower that a single subpackage 1S includes a defective semiconductor chip 30, since the number of the semiconductor chips 30 included in each subpackage 1S is two. Consequently, according to the present embodiment, a composite layered chip package 1 including no defective semiconductor chip 30 can be easily formed by stacking subpackages 1S that each include only conforming semiconductor chips 30.

According to the present embodiment, when at least one of the subpackages 1S in the composite layered chip package 1 includes the second-type layer portion 10B, the additional portions 51 can be added to the plurality of subpackages 1S to form a composite layered chip package 1. According to the present embodiment, even if at least one of the subpackages 1S includes a defective semiconductor chip 30, it is thus possible to easily provide a composite layered chip package 1 having the same functions as those of a composite layered chip package 1 that includes no defective semiconductor chip 30.

Figure 39:
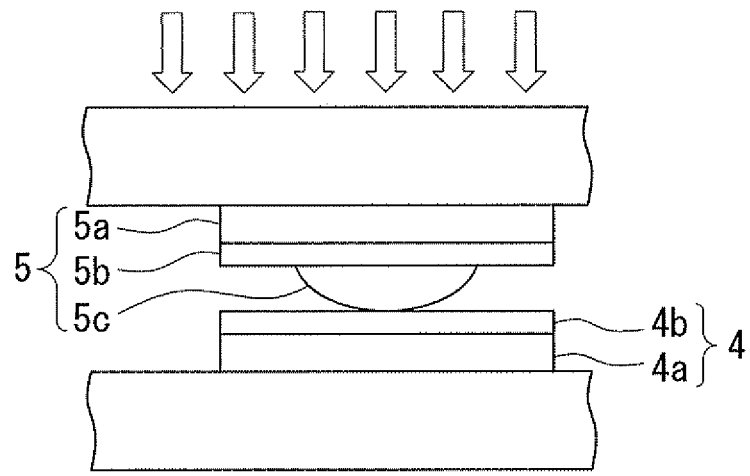
FIG. 39 is a side view showing connecting parts of the terminals of two vertically adjacent subpackages.
Figure 40:
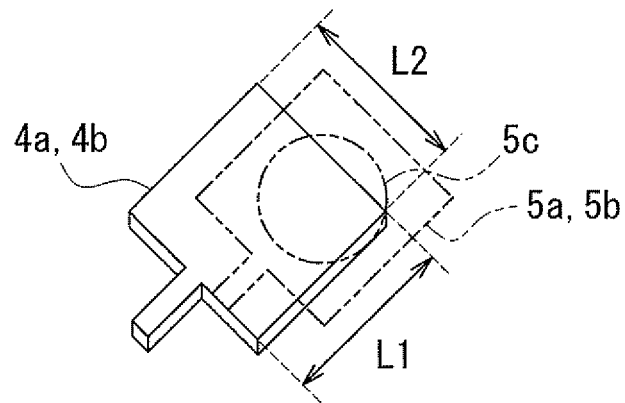
FIG. 40 is an explanatory diagram for explaining misalignment between the terminals of two vertically adjacent subpackages.

Moreover, the present embodiment facilitates the alignment between every two vertically adjacent subpackages 1S when stacking a plurality of subpackages 1S. This advantageous effect will now be described with reference to FIG. 39 and FIG. 40. FIG. 39 is a side view showing connecting parts of the terminals of two vertically adjacent subpackages 1S. FIG. 40 is an explanatory diagram for explaining misalignment between the terminals of two vertically adjacent subpackages 1S.

In the example shown in FIG. 39 and FIG. 40, the terminal 4 includes a conductor pad 4a of rectangular shape and an Au layer 4b that is formed on the surface of the conductor pad 4a. The conductor pad 4a constitutes a part of the electrode, and is made of Cu, for example. The terminal 5 includes a conductor pad 5a of rectangular shape, an underlayer 5b formed on the surface of the conductor pad 5a, and a solder layer 5c formed on the surface of the underlayer 5b. The conductor pad 5a constitutes a part of the electrode, and is made of Cu, for example. The underlayer 5b is made of Au, and the solder layer 5c is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4a will be represented by L1 and L2. L1 and L2 are both 40 to 80 µm, for example. The conductor pad 5a has the same shape as that of the conductor pad 4a.

In the example shown in FIG. 39, the corresponding terminals 4 and 5 of the two vertically adjacent subpackages 1S are electrically connected in the following way. The Au layer 4b and the solder layer 5c of the corresponding terminals 4 and 5 are put into contact with each other. By applying heat and pressure, the solder layer 5c is melted, and then solidified to bond the terminals 4 and 5 to each other.

FIG. 40 shows a state where the terminals 4 and 5 are out of alignment. The state where the terminals 4 and 5 are out of alignment refers to the state where the edges of the conductor pad 4a and those of the conductor pad 5a do not coincide in position with each other when viewed in a direction perpendicular to the plane of the conductor pads 4a and 5a. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 µm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of subpackages 1S. This facilitates the alignment between two vertically adjacent subpackages 1S. Consequently, according to the present embodiment, it is possible to reduce the manufacturing cost of the composite layered chip package 1.

For the same reason as with the stacking of a plurality of subpackages 1S as described above, the present embodiment facilitates alignment between a subpackage 1S and an additional portion 51 that are adjacent vertically or alignment between two vertically adjacent additional portions 51. Consequently, according to the present embodiment, it is possible to reduce the manufacturing cost of the composite layered chip package 1 including one or more additional portions 51.

Figure 41:
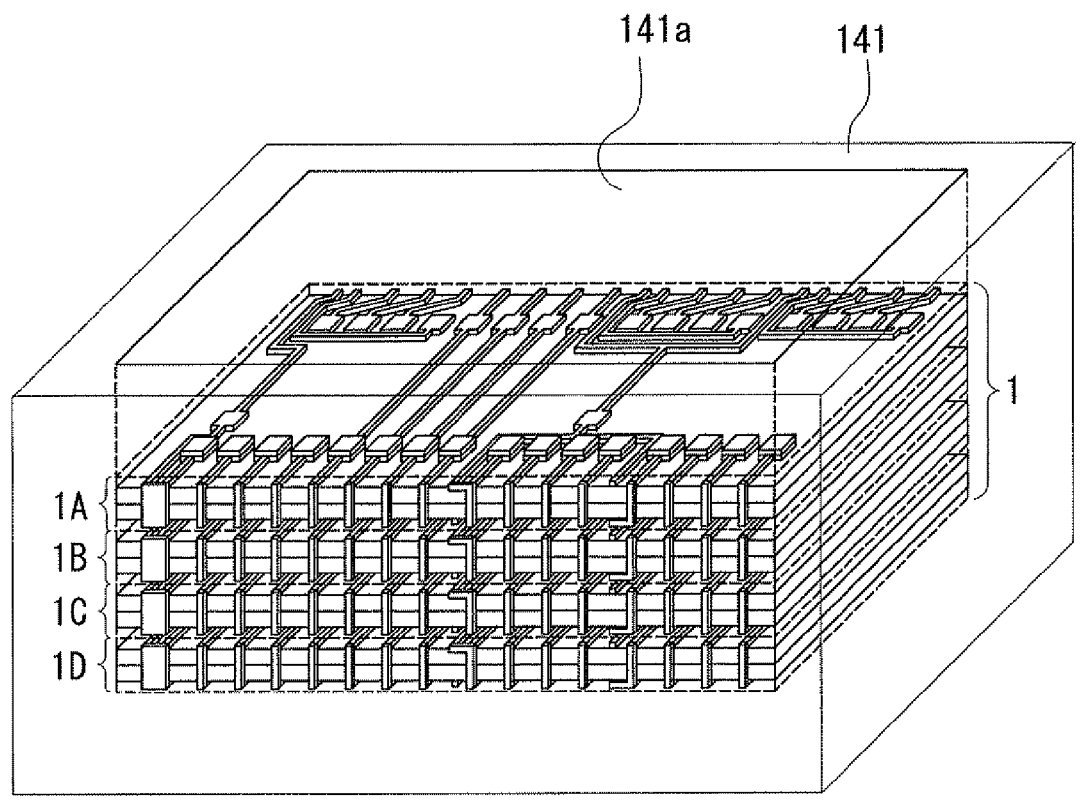
FIG. 41 is a perspective view showing an example of the method of stacking four subpackages.

FIG. 41 shows an example of a method of manufacturing a composite layered chip package 1 that includes four subpackages 1S stacked. The method shown in FIG. 41 uses a heat-proof container 141. The container 141 has an accommodating part 141a in which a plurality of subpackages 1S can be stacked and accommodated. The accommodating part 141a has such a size that the side surfaces of the subpackages 1S accommodated in the accommodating part 141a and the inner walls of the accommodating part 141a leave a slight gap therebetween. In the method, a plurality of subpackages 1S are stacked and accommodated in the accommodating part 141a of the container 141, and then the container 141 and the plurality of subpackages 1S are heated at temperatures at which the solder layer melts (for example, 320° C.). This melts the solder layer, whereby the terminals 4 and 5 of two vertically adjacent subpackages 1S are bonded to each other. According to the method, a plurality of subpackages 1S are stacked and accommodated in the accommodating part 141a of the container 141, whereby the plurality of subpackages 1S can be easily aligned with each other. This makes it easy to manufacture the composite layered chip package 1. FIG. 41 shows an example where four subpackages 1A to 1D are stacked to manufacture a composite layered chip package 1.

However, the method shown in FIG. 41 can also be used in manufacturing a composite layered chip package 1 that includes one or more additional portions 51.

In the present embodiment, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

In the present embodiment, the plurality of electrodes of the first layer portion 10S1 can be used to form the plurality of first terminals 4 even if the first layer portion 10S1 is the second-type layer portion 10B. Similarly, the plurality of electrodes of the second layer portion 10S2 can be used to form the plurality of second terminals 5 even if the second layer portion 10S2 is the second-type layer portion 10B. The plurality of electrodes of the layer portion 10B do not have the function of electrically connecting the semiconductor chip 30 to the wiring 3, but have an interposer function of electrically connecting a single subpackage 1S to another subpackage 1S or to the additional portion 51.

Regardless of whether a layer portion 10 is the first-type layer portion 10A or second-type layer portion 10B, the plurality of electrodes except the first-type and sixth-type electrodes do not have the function of electrically connecting the semiconductor chip 30 to the wiring 3, but have an interposer function of electrically connecting a single subpackage 1S to another subpackage 1S or to the additional portion 51.

In the composite layered chip package 1 according to the present embodiment, the additional portion 51 includes at least one additional semiconductor chip 80 and additional portion wiring 53. The additional portion wiring 53 defines electrical connections between the at least one additional semiconductor chip 80 and the plurality of first terminals 4 or second terminals 5 of any of the plurality of subpackages 1S so that the at least one additional semiconductor chip 80 substitutes for the semiconductor chip 30 of at least one second-type layer portion 10B. Consequently, according to the present embodiment, it is possible to easily provide a composite layered chip package 1 having the same functions as those of a composite layered chip package 1 that includes no defective semiconductor chip 30, regardless of the number and location(s) of the second-type layer portion(s) 10B in a subpackage 1S. The location(s) of the second-type layer portion(s) 10B in a subpackage 1S can be known from the location information on the normally functioning pre-semiconductor-chip portions 30P and the malfunctioning pre-semiconductor-chip portions 30P which was obtained by the wafer sort test.

According to the present embodiment, in a subpackage 1S including a plurality of semiconductor chips 30 stacked, the stacked semiconductor chips 30 are electrically connected to each other by the wiring 3 (the plurality of wires W) disposed on at least one of the side surfaces of the main body 2. The present embodiment is therefore free from the problems of the wire bonding method, that is, the problem that it is difficult to reduce the distance between the electrodes so as to avoid contact between the wires, and the problem that the high resistances of the wires hamper quick circuit operation.

As compared with the through electrode method, the present embodiment has the following advantages. First, the present embodiment does not require the formation of through electrodes in each chip and consequently does not require a large number of steps for forming through electrodes in each chip. Moreover, the present embodiment provides higher reliability of electrical connection between a plurality of chips as compared with the case where through electrodes are used to establish electrical connection between the chips.

Furthermore, according to the present embodiment, it is possible to easily change the line width and thickness of the wiring 3. Consequently, it is possible to easily cope with future demands for finer wiring 3.

The through electrode method requires that the through electrodes of vertically adjacent chips be connected to each other by means of, for example, soldering at high temperatures. In contrast, according to the present embodiment, it is possible to form the wiring 3 at lower temperatures since the wiring 3 can be formed by plating. According to the present embodiment, it is also possible to bond the plurality of layer portions 10 to each other at low temperatures. Consequently, it is possible to prevent the chips 30 from suffering damage from heat.

The through electrode method further requires accurate alignment between vertically adjacent chips in order to connect the through electrodes of the vertically adjacent chips to each other. In contrast, according to the present embodiment, electrical connection between a plurality of semiconductor chips 30 is established not at an interface between two layer portions 10 but through the use of the wiring 3 disposed on at least one of the side surfaces of the main body 2. The alignment between two layer portions 10 therefore requires lower accuracy than that required for the alignment between a plurality of chips in the through electrode method.

In the present embodiment, the method of manufacturing a plurality of subpackages 1S includes the steps of fabricating a plurality of substructures 110; fabricating a plurality of first layered substructures 115 by using the plurality of substructures 110, each of the plurality of first layered substructures 115 including two substructures 110 stacked; and forming the plurality of subpackages 1S from the plurality of first layered substructures 115. Each of the first layered substructures 115 includes an array of a plurality of pre-separation main bodies 2P. The plurality of pre-separation main bodies 2P are to be separated from each other into individual main bodies 2 later.

The step of forming the plurality of subpackages 1S includes the steps of: fabricating the second layered substructure 120 by stacking the plurality of first layered substructures 115 and bonding every two adjacent first layered substructures 115 to each other; cutting the second layered substructure 120 into at least one block 121 that includes a plurality of pre-separation main bodies 2P arranged both in the direction of stacking of the first layered substructures 115 and in a direction orthogonal thereto; forming the wiring 3 on the plurality of pre-separation main bodies 2P included in the at least one block 121 simultaneously; and separating the plurality of pre-separation main bodies 2P each provided with the wiring 3 from each other so as to form the plurality of subpackages 1S.

Such a manufacturing method for the subpackages 1S makes it possible to simultaneously form a plurality of sets of the terminals 4 and 5 corresponding to the plurality of subpackages 1S in the step of fabricating the first layered substructures 115. Moreover, according to the manufacturing method, the wiring 3 is formed simultaneously on the plurality of pre-separation main bodies 2P included in one or more blocks 121. This makes it possible to form a plurality of units of wiring 3 corresponding to the plurality of subpackages 1S simultaneously. Here, it is unnecessary to perform alignment between the plurality of pre-separation main bodies 2P included in each block 121. Consequently, according to the manufacturing method, it is possible to mass-produce the subpackages 1S that are capable of being electrically connected to each other easily, at low cost in a short time.

In the step of forming the wiring 3 in the foregoing manufacturing method, two or more blocks 121 may be arranged such that all the pre-separation main bodies 2P included in the two or more blocks 121 are directed with their surfaces for the wiring 3 to be formed on toward the same direction. Then, the wiring 3 may be formed simultaneously on all the pre-separation main bodies 2P included in the two or more blocks 121. This makes it possible to simultaneously form the wiring 3 for a larger number of pre-separation main bodies 2P.

The foregoing method of manufacturing the subpackages 1S allows a reduction in the number of steps and consequently allows a reduction in cost for the subpackages 1S, as compared with the manufacturing method for a layered chip package disclosed in U.S. Pat. No. 5,953,588.

According to the method of manufacturing the subpackages 1S of the present embodiment, the first layered substructure 115 is fabricated by the method described with reference to FIG. 24 to FIG. 27. This makes it possible to easily reduce the thickness of the two substructures 110 that constitute the first layered substructure 115 while preventing damage to the substructures 110. The present embodiment thus allows a high-yield manufacture of the subpackages 1S that achieve a smaller size and higher integration.

Second Embodiment

Figure 42:
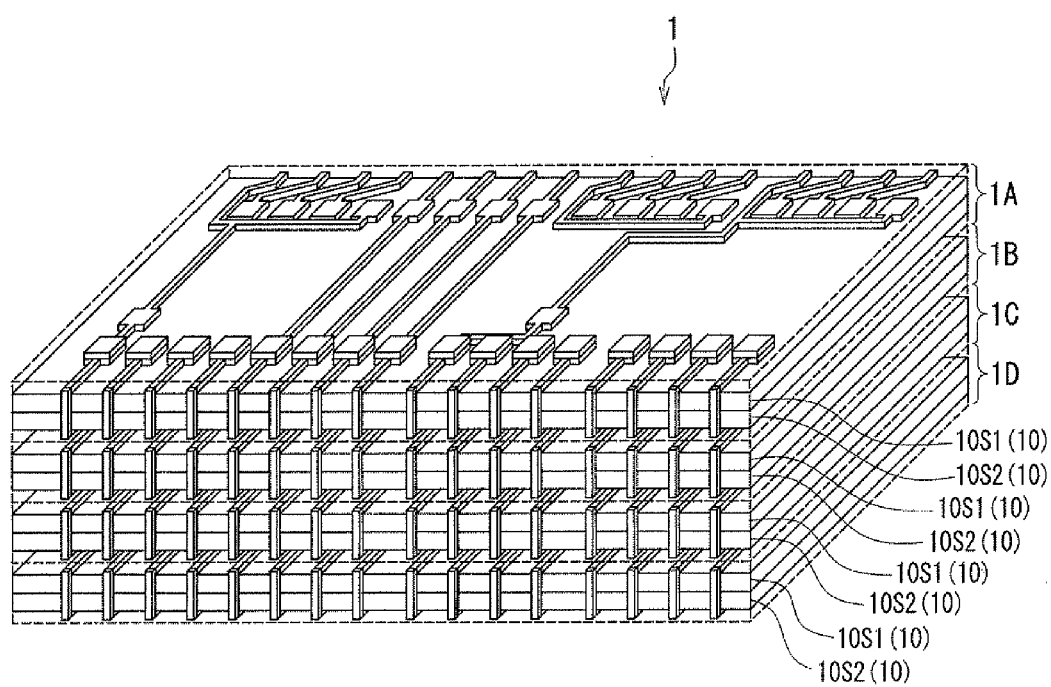
FIG. 42 is a perspective view of a composite layered chip package according to a second embodiment of the invention.
Figure 43:
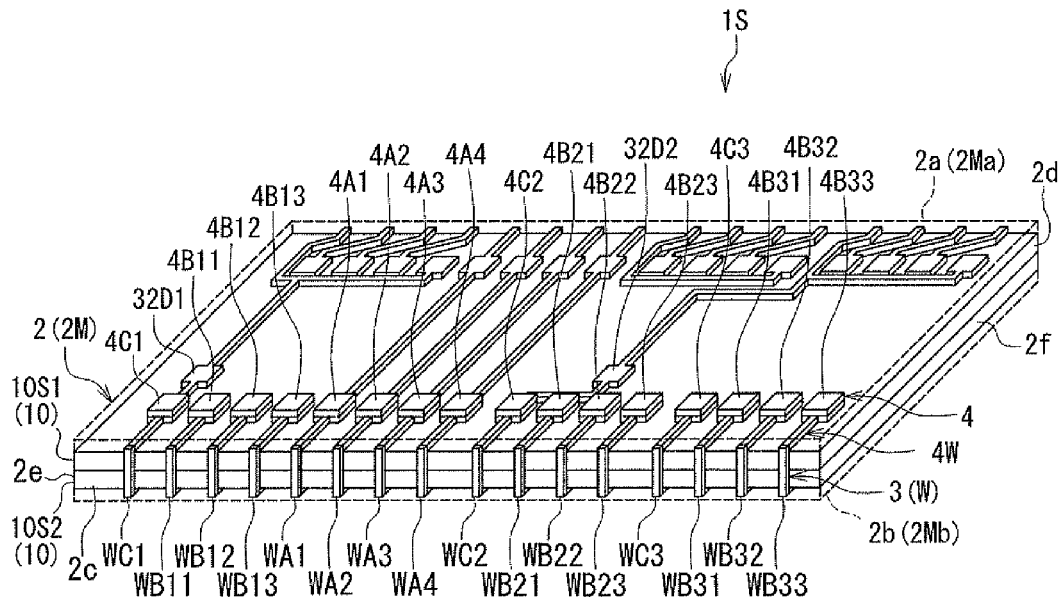
FIG. 43 is a perspective view of a layered chip package according to the second embodiment of the invention.
Figure 44:
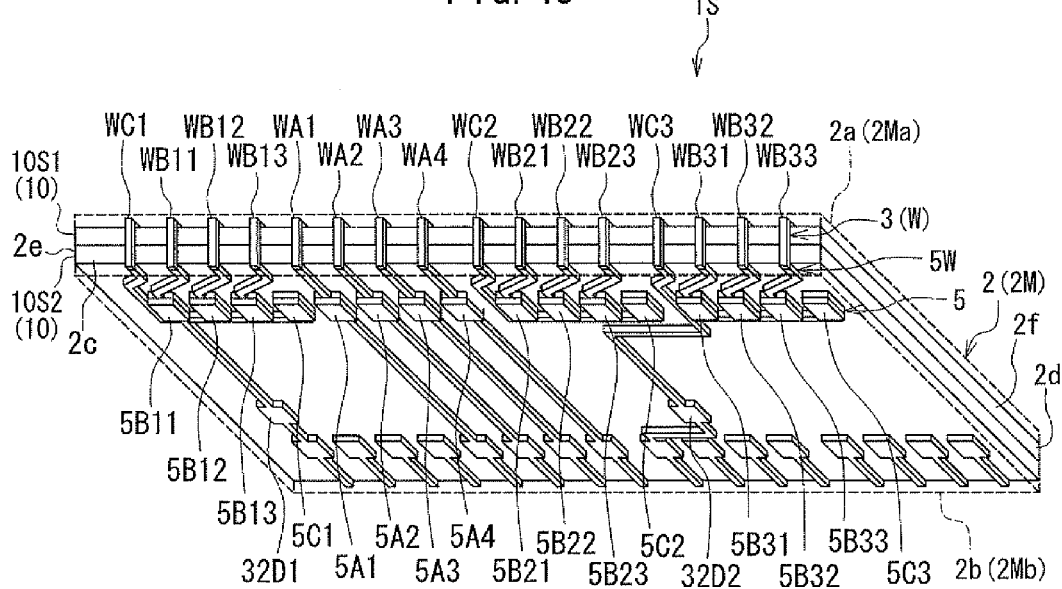
FIG. 44 is a perspective view showing the layered chip package of FIG. 43 as viewed from below.
Figure 45:
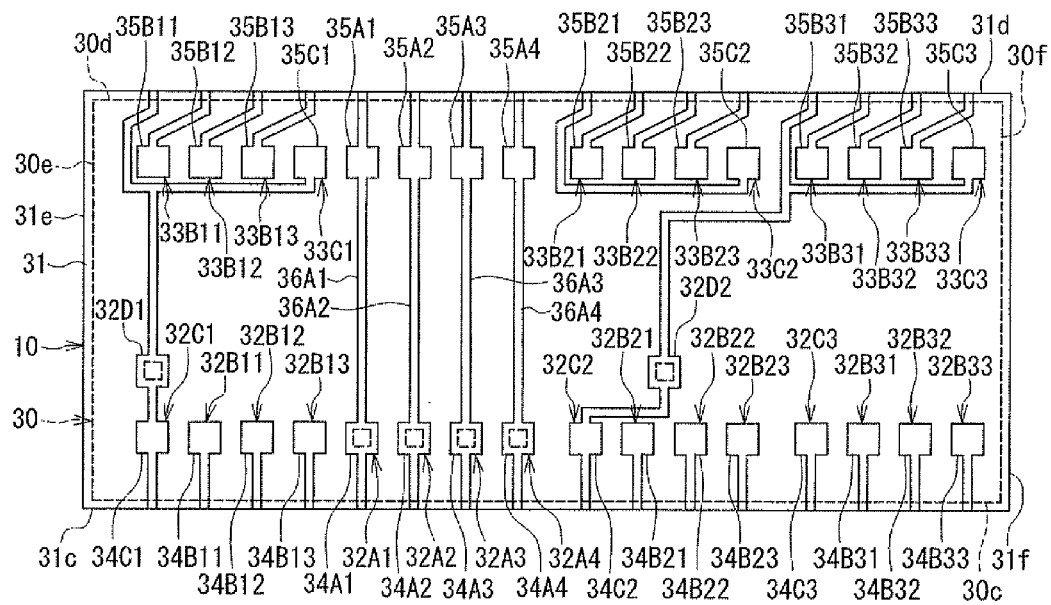
FIG. 45 is a plan view showing a layer portion included in the layered chip package of FIG. 43.
Figure 46:
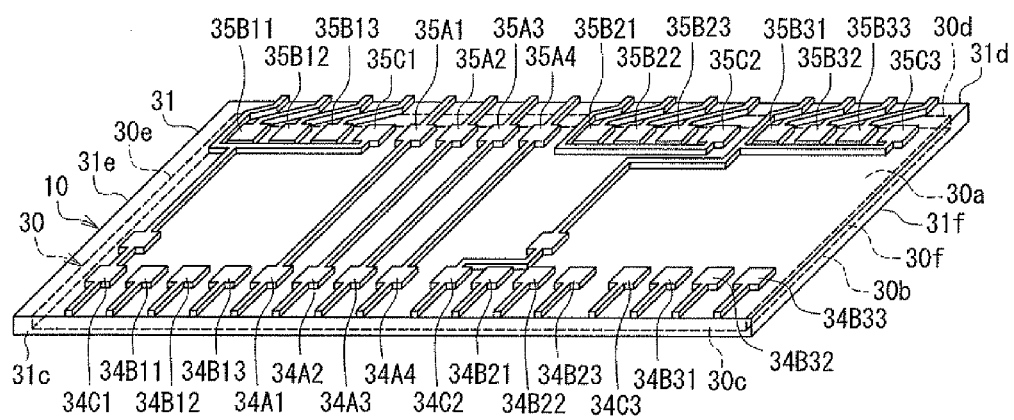
FIG. 46 is a perspective view of the layer portion shown in FIG. 45.

A second embodiment of the invention will now be described. First, reference is made to FIG. 42 to FIG. 46 to describe the configurations of a layered chip package and a composite layered chip package according to the present embodiment. FIG. 42 is a perspective view of the composite layered chip package according to the present embodiment. FIG. 43 is a perspective view of the layered chip package according to the present embodiment. FIG. 44 is a perspective view showing the layered chip package of FIG. 43 as viewed from below. FIG. 45 is a plan view showing a layer portion included in the layered chip package of FIG. 43. FIG. 46 is a perspective view of the layer portion shown in FIG. 45.

As shown in FIG. 45 and FIG. 46, in each layer portion 10 of the subpackage 1S or the layered chip package according to the present embodiment, the electrode 32D1 does not have the first and second end faces described in the first embodiment, and is electrically connected to the electrodes 32C1 and 33C1. The electrode 32D2 does not have the first to fourth branched parts described in the first embodiment, and is electrically connected to the electrodes 32C2 and 33C3.

As shown in FIG. 43 and FIG. 44, in the subpackage 1S according to the present embodiment, the electrode 32D1 of the first layer portion 10S1 and the electrode 32D1 of the second layer portion 10S2 are not directly connected to the wire WC1. Instead, the electrode 32D1 of the layer portion 10S1 is electrically connected to the wire WC1 via the electrode 32C1. The electrode 32D1 of the layer portion 10S2 is electrically connected to the wire WC1 via the electrode 33C1.

In the present embodiment, the electrode 32D2 of the layer portion 10S1 is not directly connected to the wire WC2. Instead, the electrode 32D2 of the layer portion 10S1 is electrically connected to the wire WC2 via the electrode 32C2.

In the present embodiment, the electrode 32D2 of the layer portion 10S2 is not directly connected to the wire WC3. Instead, the electrode 32D2 of the layer portion 10S2 is electrically connected to the wire WC3 via the electrode 33C3.

The remainder of configuration of the subpackage 1S according to the present embodiment is the same as that of the subpackage 1S of the first embodiment. The subpackage 1S according to the present embodiment has the same functions as those of the subpackage 1S of the first embodiment.

The composite layered chip package 1 shown in FIG. 42 includes four subpackages 1A, 1B, 1C, and 1D that are arranged in order from the top. Each of the subpackages 1A, 1B, 1C, and 1D consists of the subpackage 1S shown in FIG. 43 and FIG. 44.

The composite layered chip package 1 according to the present embodiment has the same plurality of electrical paths as those of the composite layered chip package 1 according to the first embodiment.

Figure 47:
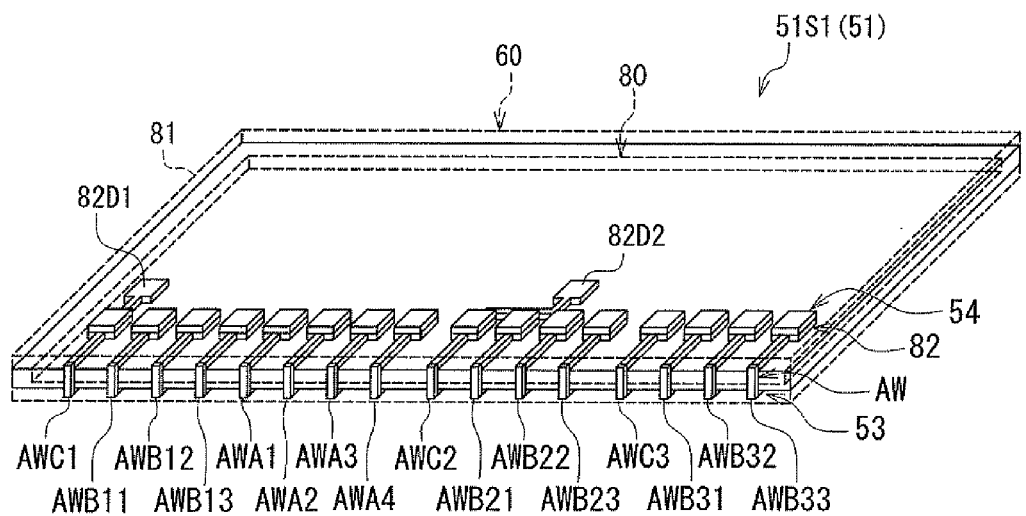
FIG. 47 is a perspective view showing a first example of an additional portion in the second embodiment of the invention.
Figure 48:
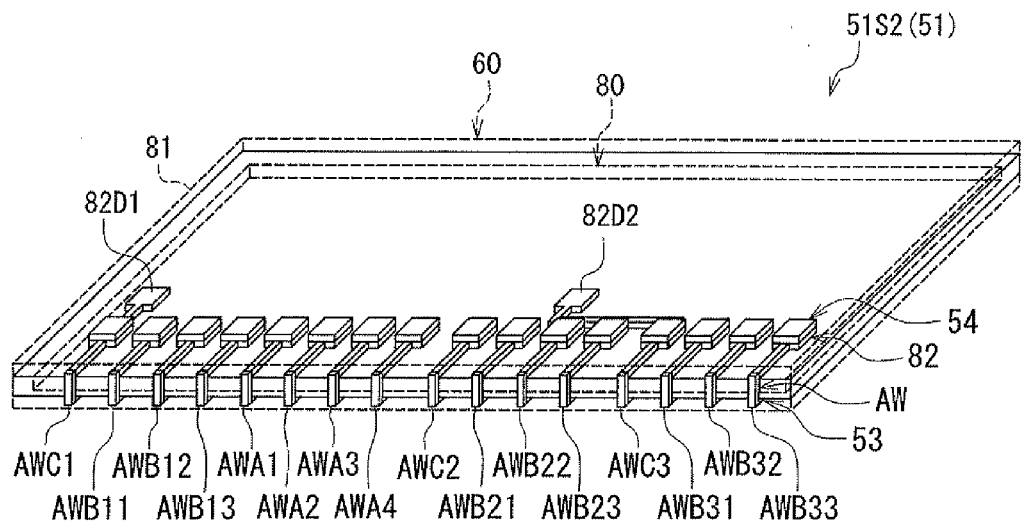
FIG. 48 is a perspective view showing a second example of the additional portion in the second embodiment of the invention.

First and second examples of the additional portion 51 of the present embodiment will now be described with reference to FIG. 47 and FIG. 48. Hereinafter, the first example of the additional portion 51 will be designated by reference symbol 51S1, and the second example of the additional portion 51 will be designated by reference symbol 51S2. FIG. 47 is a perspective view of the additional portion 51S1. FIG. 48 is a perspective view of the additional portion 51S2.

In the additional portion 51S1 shown in FIG. 47, the electrode 82D1 is not directly connected to the wire AWC1, but is electrically connected to an electrode that is electrically connected to the wire AWC1. The electrode 82D1 of the additional portion 51S1 is thereby electrically connected to the wire AWC1. The electrode 82D2 of the additional portion 51S1 is not directly connected to the wire AWC2, but is electrically connected to an electrode that is electrically connected to the wire AWC2. The electrode 82D2 of the additional portion 51S1 is thereby electrically connected to the wire AWC2. The remainder of the configuration of the additional portion 51S1 shown in FIG. 47 is the same as that of the additional portion 51S1 of the first embodiment. The additional portion 51S1 shown in FIG. 47 has the same functions as those of the additional portion 51S1 of the first embodiment.

In the additional portion 51S2 shown in FIG. 48, the electrode 82D1 is not directly connected to the wire AWC1, but is electrically connected to an electrode that is electrically connected to the wire AWC1. The electrode 82D1 of the additional portion 51S2 is thereby electrically connected to the wire AWC1. The electrode 82D2 of the additional portion 51S2 is not directly connected to the wire AWC3, but is electrically connected to an electrode that is electrically connected to the wire AWC3. The electrode 82D2 of the additional portion 51S2 is thereby electrically connected to the wire AWC3. The remainder of the configuration of the additional portion 51S2 shown in FIG. 48 is the same as that of the additional portion 51S2 of the first embodiment. The additional portion 51S2 shown in FIG. 48 has the same functions as those of the additional portion 51S2 of the first embodiment.

According to the present embodiment, there is no need to broaden the wire WC1 of the subpackage 1S or partly broaden the wires WC2 and WC3 of the subpackage 1S, the wire AWC2 of the additional portion 51S1, or the wire AWC3 of the additional portion 51S2.

The remainder of configuration, function and effects of the present embodiment are similar to those of the first embodiment.

The present invention is not limited to the foregoing embodiments, and various modifications may be made thereto. For example, in each of the embodiments, a plurality of blocks 121 are arranged to form a block assembly 130, and further, a plurality of block assemblies 130 are arranged so that the wiring 3 is formed simultaneously on all of the pre-separation main bodies 2P that are included in the plurality of block assemblies 130. However, the wiring 3 may be simultaneously formed on all of the pre-separation main bodies 2P that are included in a single block assembly 130, or all of the pre-separation main bodies 2P that are included in a single block 121. After the plurality of pre-separation main bodies 2P each provided with the wiring 3 are separated from each other into a plurality of main bodies 2, additional wiring may be formed on the main bodies 2.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising:
a main body having a top surface, a bottom surface, and four side surfaces; and
wiring that includes a plurality of wires disposed on at least one of the side surfaces of the main body, wherein:
the main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires;
each of the first and second layer portions includes a semiconductor chip and a plurality of electrodes, the semiconductor chip having a first surface and a second surface opposite to the first surface;
the plurality of electrodes are disposed on a side of the semiconductor chip opposite to the second surface;
the first layer portion and the second layer portion are bonded to each other such that the respective second surfaces face each other;
the plurality of first terminals are formed by using the plurality of electrodes of the first layer portion;
the plurality of second terminals are formed by using the plurality of electrodes of the second layer portion;
the plurality of electrodes of the first layer portion include one or more electrodes that are not used to form the plurality of first terminals; and
the plurality of electrodes of the second layer portion include one or more electrodes that are not used to form the plurality of second terminals.

2. The layered chip package according to claim 1, wherein:
the plurality of electrodes of the first layer portion and those of the second layer portion have the same layout; and
the plurality of electrodes include a plurality of first terminal component parts that are used to form the plurality of first terminals in the first layer portion, and a plurality of second terminal component parts that are used to form the plurality of second terminals in the second layer portion.

3. The layered chip package according to claim 2, wherein the plurality of electrodes further include one or more connecting parts that electrically connect one of the first terminal component parts and one of the second terminal component parts to each other.

4. The layered chip package according to claim 1, wherein:
the plurality of electrodes include a plurality of chip connection electrodes for electrical connection to the semiconductor chip; and in at least one of the first and second layer portions, the plurality of chip connection electrodes are in contact with and electrically connected to the semiconductor chip.

5. The layered chip package according to claim 1, wherein the semiconductor chip includes a plurality of memory cells.

6. The layered chip package according to claim 1, wherein:
the semiconductor chip has four side surfaces;
each of the first and second layer portions further includes an insulating portion that covers at least one of the four side surfaces of the semiconductor chip; and
the insulating portion has at least one end face that is located in the at least one of the side surfaces of the main body on which the plurality of wires are disposed.

7. A composite layered chip package comprising a plurality of subpackages stacked, every vertically adjacent two of the subpackages being electrically connected to each other, wherein:
each of the plurality of subpackages includes: a main body having a top surface, a bottom surface and four side surfaces; and wiring that includes a plurality of wires disposed on at least one of the side surfaces of the main body;
the main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires;
each of the first and second layer portions includes a semiconductor chip and a plurality of electrodes, the semiconductor chip having a first surface and a second surface opposite to the first surface;
the plurality of electrodes are disposed on a side of the semiconductor chip opposite to the second surface;
the first layer portion and the second layer portion are bonded to each other such that the respective second surfaces face each other;
the plurality of first terminals are formed by using the plurality of electrodes of the first layer portion;
the plurality of second terminals are formed by using the plurality of electrodes of the second layer portion;
the plurality of electrodes of the first layer portion include one or more electrodes that are not used to form the plurality of first terminals;
the plurality of electrodes of the second layer portion include one or more electrodes that are not used to form the plurality of second terminals; and
for any vertically adjacent two of the subpackages, the plurality of second terminals of the upper one of the subpackages are electrically connected to the plurality of first terminals of the lower one.

8. The composite layered chip package according to claim 7, wherein:
the plurality of electrodes of the first layer portion and those of the second layer portion have the same layout; and
the plurality of electrodes include a plurality of first terminal component parts that are used to form the plurality of first terminals in the first layer portion, and a plurality of second terminal component parts that are used to form the plurality of second terminals in the second layer portion.

9. The composite layered chip package according to claim 8, wherein the plurality of electrodes further include one or more connecting parts that electrically connect one of the first terminal component parts and one of the second terminal component parts to each other.

10. The composite layered chip package according to claim 7, wherein:
the plurality of electrodes include a plurality of chip connection electrodes for electrical connection to the semiconductor chip; and
in at least one of the first and second layer portions, the plurality of chip connection electrodes are in contact with and electrically connected to the semiconductor chip.

11. The composite layered chip package according to claim 7, wherein the semiconductor chip includes a plurality of memory cells.

12. A layered chip package comprising:
a main body having a top surface, a bottom surface, and four side surfaces; and
wiring that includes a plurality of wires disposed on at least one of the side surfaces of the main body, wherein:
the main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires;
each of the first and second layer portions includes a semiconductor chip and a plurality of electrodes, the semiconductor chip having a first surface and a second surface opposite to the first surface;
the plurality of electrodes are disposed on a side of the semiconductor chip opposite to the second surface;
the first layer portion and the second layer portion are bonded to each other such that the respective second surfaces face each other;
the plurality of first terminals are formed by using the plurality of electrodes of the first layer portion;
the plurality of second terminals are formed by using the plurality of electrodes of the second layer portion;
the plurality of second terminals are positioned to overlap the plurality of first terminals as viewed in a direction perpendicular to the top surface of the main body;
the plurality of second terminals are electrically connected to corresponding ones of the first terminals via the respective wires to constitute a plurality of pairs of the first and second terminals, the first and second terminals in each of the pairs being electrically connected to each other; and
the plurality of pairs include a plurality of non-overlapping terminal pairs, each of the non-overlapping terminal pairs consisting of any one of the first terminals and any one of the second terminals, the first and second terminals in each of the non-overlapping terminal pairs being electrically connected to each other and being positioned not to overlap each other as viewed in the direction perpendicular to the top surface of the main body.

13. The layered chip package according to claim 12, wherein the plurality of pairs further include a plurality of overlapping terminal pairs, each of the overlapping terminal pairs consisting of any one of the first terminals and any one of the second terminals, the first and second terminals in each of the overlapping terminal pairs being electrically connected to each other and being positioned to overlap each other as viewed in the direction perpendicular to the top surface of the main body.

14. The layered chip package according to claim 12, wherein the plurality of wires include: a chip connection wire that is electrically connected to any one of the plurality of non-overlapping terminal pairs and used for electrical connection to the semiconductor chip of at least one of the first and second layer portions; and a bypass wire that is electrically connected to any one of the plurality of non-overlapping terminal pairs and to neither of the semiconductor chips included in the first and second layer portions.

15. A layered chip package comprising:
a main body having a top surface, a bottom surface, and four side surfaces; and
wiring that includes a plurality of wires disposed on at least one of the side surfaces of the main body, wherein:
the main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires;
each of the first and second layer portions includes a semiconductor chip and a plurality of electrodes, the semiconductor chip having a first surface and a second surface opposite to the first surface;
the plurality of electrodes are disposed on a side of the semiconductor chip opposite to the second surface;
the first layer portion and the second layer portion are bonded to each other such that the respective second surfaces face each other;
the plurality of first terminals are formed by using the plurality of electrodes of the first layer portion;
the plurality of second terminals are formed by using the plurality of electrodes of the second layer portion;
one of the first and second layer portions is a first-type layer portion, whereas the other of the first and second layer portions is a second-type layer portion;
in the first-type layer portion, the semiconductor chip is electrically connected to two or more of the plurality of wires; and
in the second-type layer portion, the semiconductor chip is electrically connected to none of the wires.

16. The layered chip package according to claim 15, wherein the semiconductor chip of the first-type layer portion is a normally functioning one, whereas the semiconductor chip of the second-type layer portion is a malfunctioning one.

17. A composite layered chip package comprising a plurality of subpackages stacked, every vertically adjacent two of the subpackages being electrically connected to each other, wherein:
each of the plurality of subpackages includes: a main body having a top surface, a bottom surface and four side surfaces; and wiring that includes a plurality of wires disposed on at least one of the side surfaces of the main body;
the main body includes: a main part that includes a first layer portion and a second layer portion stacked, the main part having a top surface and a bottom surface;
a plurality of first terminals that are disposed on the top surface of the main part and electrically connected to the plurality of wires; and a plurality of second terminals that are disposed on the bottom surface of the main part and electrically connected to the plurality of wires;
each of the first and second layer portions includes a semiconductor chip and a plurality of electrodes, the semiconductor chip having a first surface and a second surface opposite to the first surface;
the plurality of electrodes are disposed on a side of the semiconductor chip opposite to the second surface;
the first layer portion and the second layer portion are bonded to each other such that the respective second surfaces face each other;
the plurality of first terminals are formed by using the plurality of electrodes of the first layer portion;
the plurality of second terminals are formed by using the plurality of electrodes of the second layer portion;
the plurality of second terminals are positioned to overlap the plurality of first terminals as viewed in a direction perpendicular to the top surface of the main body;
the plurality of second terminals are electrically connected to corresponding ones of the first terminals via the respective wires to constitute a plurality of pairs of the first and second terminals, the first and second terminals in each of the pairs being electrically connected to each other;
the plurality of pairs include a plurality of non-overlapping terminal pairs, each of the non-overlapping terminal pairs consisting of any one of the first terminals and any one of the second terminals, the first and second terminals in each of the non-overlapping terminal pairs being electrically connected to each other and being positioned not to overlap each other as viewed in the direction perpendicular to the top surface of the main body; and
for any vertically adjacent two of the subpackages, the plurality of second terminals of the upper one of the subpackages are electrically connected to the plurality of first terminals of the lower one.

18. The composite layered chip package according to claim 17, wherein the plurality of pairs further include a plurality of overlapping terminal pairs, each of the overlapping terminal pairs consisting of any one of the first terminals and any one of the second terminals, the first and second terminals in each of the overlapping terminal pairs being electrically connected to each other and being positioned to overlap each other as viewed in the direction perpendicular to the top surface of the main body.

19. The composite layered chip package according to claim 17, wherein the plurality of wires include: a chip connection wire that is electrically connected to any one of the plurality of non-overlapping terminal pairs and used for electrical connection to the semiconductor chip of at least one of the first and second layer portions; and a bypass wire that is electrically connected to any one of the plurality of non-overlapping terminal pairs and to neither of the semiconductor chips included in the first and second layer portions.

20. A composite layered chip package comprising a plurality of subpackages stacked, every vertically adjacent two of the subpackages being electrically connected to each other, wherein:
each of the plurality of subpackages includes: a main body having a top surface, a bottom surface and four side surfaces; and wiring that includes a plurality of wires disposed on at least one of the side surfaces of the main body;
the main body includes: a main part that includes a first layer portion and a second layer portion stacked, the main part having a top surface and a bottom surface; a plurality of first terminals that are disposed on the top surface of the main part and electrically connected to the plurality of wires; and a plurality of second terminals that are disposed on the bottom surface of the main part and electrically connected to the plurality of wires;

each of the first and second layer portions includes a semiconductor chip and a plurality of electrodes, the semiconductor chip having a first surface and a second surface opposite to the first surface;

the plurality of electrodes are disposed on a side of the semiconductor chip opposite to the second surface;

the first layer portion and the second layer portion are bonded to each other such that the respective second surfaces face each other;

the plurality of first terminals are formed by using the plurality of electrodes of the first layer portion;

the plurality of second terminals are formed by using the plurality of electrodes of the second layer portion;

for any vertically adjacent two of the subpackages, the plurality of second terminals of the upper one of the subpackages are electrically connected to the plurality of first terminals of the lower one;

in at least one of the plurality of subpackages, one of the first and second layer portions is a first-type layer portion, whereas the other of the first and second layer portions is a second-type layer portion;

in the first-type layer portion, the semiconductor chip is electrically connected to two or more of the plurality of wires; and in the second-type layer portion, the semiconductor chip is electrically connected to none of the wires, the composite layered chip package further comprising an additional portion that is electrically connected to any of the plurality of subpackages, the additional portion including:

at least one additional semiconductor chip; and additional portion wiring that defines electrical connections between the at least one additional semiconductor chip and the plurality of first or second terminals of any of the plurality of subpackages so that the at least one additional semiconductor chip substitutes for the semiconductor chip of the second-type layer portion of at least one of the subpackages.

21. The composite layered chip package according to claim 20, wherein:

the additional portion includes an additional portion main body having a top surface, a bottom surface, and four side surfaces;

the additional portion main body includes the at least one additional semiconductor chip; and the additional portion wiring includes:

a plurality of additional portion wires that are disposed on at least one of the side surfaces of the additional portion main body;

a plurality of first additional portion terminals that are disposed on the top surface of the additional portion main body and electrically connected to the plurality of additional portion wires; and a plurality of second additional portion terminals that are disposed on the bottom surface of the additional portion main body and electrically connected to the plurality of additional portion wires.

22. The composite layered chip package according to claim 20, wherein the semiconductor chip in each of the layer portions and the additional semiconductor chip each include a plurality of memory cells.

* * * * *